United States Patent
Sasaki et al.

(10) Patent No.: US 8,649,409 B2
(45) Date of Patent: Feb. 11, 2014

(54) SURFACE-EMITTING LASER DEVICE, OPTICAL SCANNER DEVICE, AND IMAGE FORMING APPARATUS

(75) Inventors: Toshihide Sasaki, Miyagi (JP); Kazuhiro Harasaka, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/562,896

(22) Filed: Jul. 31, 2012

(65) Prior Publication Data

US 2013/0033559 A1 Feb. 7, 2013

(30) Foreign Application Priority Data

Aug. 1, 2011 (JP) .................................. 2011-167955

(51) Int. Cl.
*H01S 5/00* (2006.01)
(52) U.S. Cl.
USPC ............... 372/49.01; 372/46.01; 372/46.013; 372/45.01; 372/50.11
(58) Field of Classification Search
USPC ......... 372/49.01, 45.01, 46.01, 46.013, 50.11
See application file for complete search history.

(56) References Cited

U.S. PATENT DOCUMENTS

| 6,483,860 | B1 | 11/2002 | Ueki et al. |
| 7,978,739 | B2 | 7/2011 | Sugawara et al. |
| 8,035,676 | B2 | 10/2011 | Harasaka et al. |
| 8,111,725 | B2 | 2/2012 | Ishii et al. |
| 2001/0026567 | A1* | 10/2001 | Kaneko et al. ............... 372/43 |
| 2010/0311194 | A1 | 12/2010 | Sasaki et al. |
| 2011/0115872 | A1 | 5/2011 | Harasaka et al. |
| 2011/0128343 | A1 | 6/2011 | Sato et al. |
| 2011/0170155 | A1 | 7/2011 | Jikutani et al. |
| 2011/0211869 | A1 | 9/2011 | Shouji et al. |
| 2011/0217077 | A1 | 9/2011 | Harasaka et al. |
| 2011/0228035 | A1 | 9/2011 | Ishii et al. |
| 2012/0057902 | A1 | 3/2012 | Shouji et al. |
| 2012/0086765 | A1* | 4/2012 | Higashi et al. ............... 347/248 |
| 2012/0121297 | A1 | 5/2012 | Jikutani et al. |

FOREIGN PATENT DOCUMENTS

| JP | 3566902 | 9/2004 |
| JP | 4010095 | 11/2007 |
| JP | 2010-153768 | 7/2010 |
| JP | 2010-267946 | 11/2010 |
| JP | 2011-009693 | 1/2011 |
| JP | 2011-018876 | 1/2011 |
| WO | WO2011/148957 A1 | 12/2011 |

* cited by examiner

*Primary Examiner* — Kinam Park
(74) *Attorney, Agent, or Firm* — Cooper & Dunham LLP

(57) ABSTRACT

A surface-emitting laser device includes a lower reflector, a resonator structure having an active layer and an upper reflector on an inclined substrate, and an emission region emitting laser light enclosed by an electrode. The upper reflector includes a confinement structure having a current passing region enclosed by an oxide containing at least an oxide generated as a result of partial oxidation of a layer containing aluminum subject to selective oxidation, and a dielectric film formed within the emission region, the dielectric film at least enclosing a partial region including a center of the emission region. In viewing from a direction orthogonal to the emission region, a center of a region enclosed by the dielectric film is located at a position distant from the center of the emission region based on a size of the confinement structure relative to a direction orthogonal to an inclined axis of the inclined substrate.

11 Claims, 28 Drawing Sheets

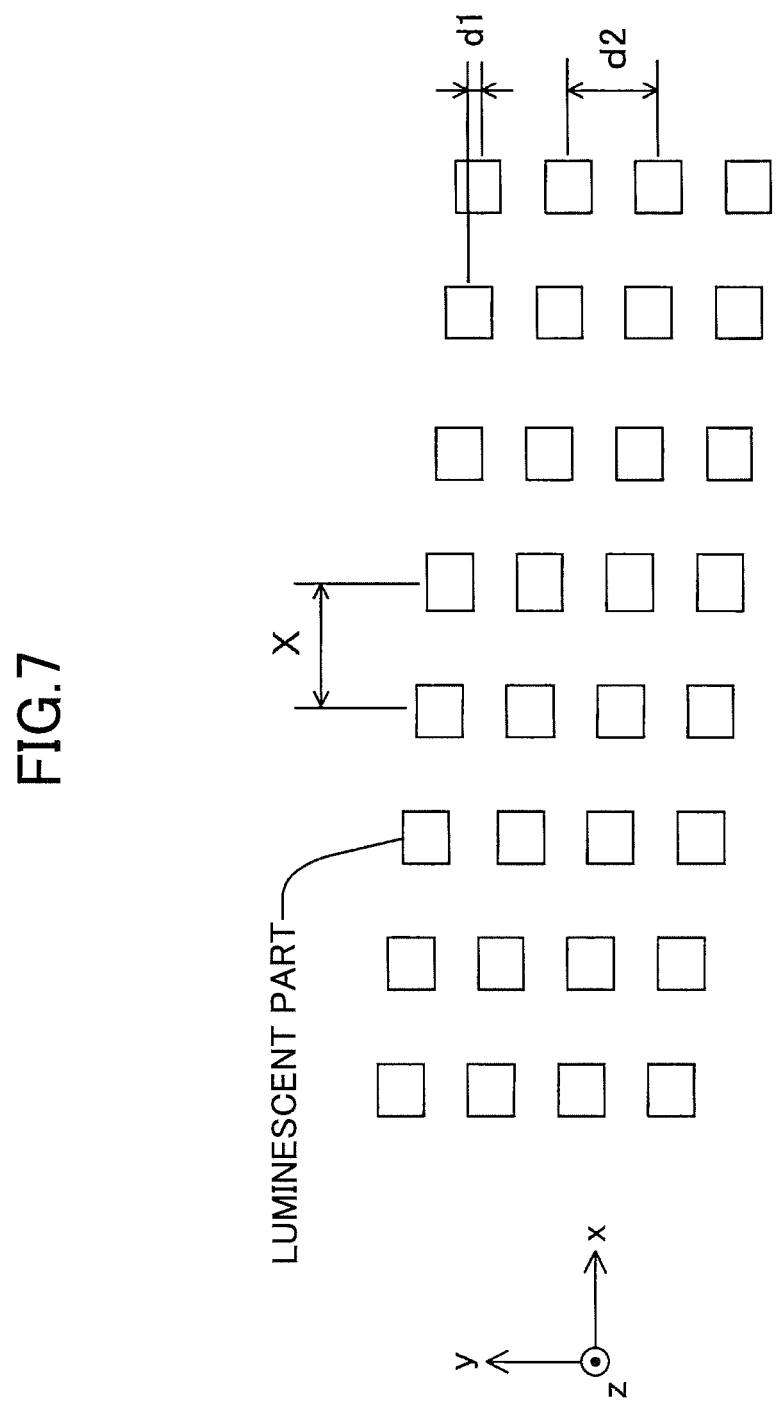

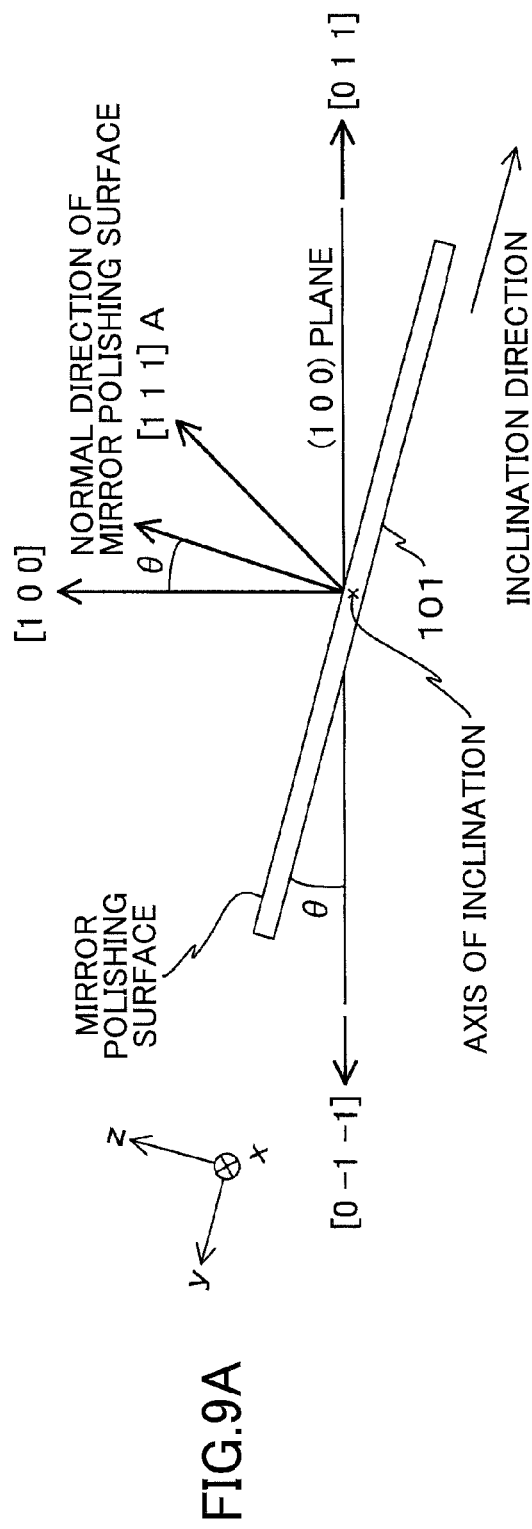
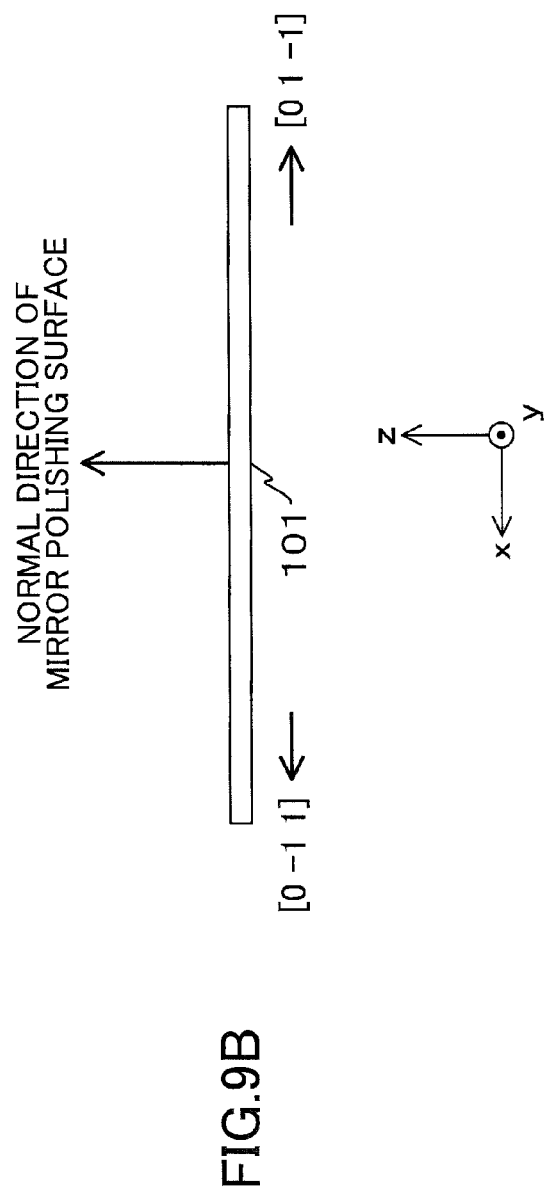
FIG.9A
FIG.9B

SURFACE-EMITTING LASER DEVICE, OPTICAL SCANNER DEVICE, AND IMAGE FORMING APPARATUS

BACKGROUND OF THE INVENTION

1. Field of the Invention

The disclosures herein generally relate to a surface-emitting laser device, an optical scanner device and an image forming apparatus, and more particularly to a surface-emitting laser device capable of oscillating laser light in a direction orthogonal to a substrate, an optical scanner device having such a surface-emitting laser device, and an image forming apparatus having such an optical scanner device.

2. Description of the Related Art

A vertical cavity surface-emitting laser (VCSEL) device is a semiconductor laser device that oscillates laser light in a direction orthogonal to a substrate. The VCSEL generally has features such as (1) a low price, (2) low power consumption, (3) high performance with a smaller size and (4) easy to integrate two-dimensionally compared to an edge emitting laser (EEL) that oscillates laser in a direction parallel to a substrate.

The surface-emitting laser device (VCSEL) includes a confinement structure to enhance electric current injecting efficiency. As an example of such a confinement structure, a confinement structure obtained by selectively oxidizing aluminum-arsenic (AlAs) (hereinafter also called an "oxide confinement structure" for convenience) is frequently used.

The oxide confinement structure is obtained by forming a mesa of a predetermined size having a layer subject to selective oxidation (hereinafter also called a "selective oxidation layer") that is formed of a p-AlAs layer exposed from sides of the mesa, and subsequently placing the mesa under a high-temperature water-vapor atmosphere to selectively oxidize Al from sides of the mesa, thereby causing an unoxidized region to remain in the selectively oxidized p-AlAs layer (i.e., the selective oxidation layer) near the center of the mesa. This unoxidized region corresponds to a drive current passing region (current injecting region) of a surface-emitting layer device. Thus, it may be easy to confine the electric current.

The refractive index of the oxidized Al (AlxOy) layer in the oxide confinement structure is approximately 1.6, which is lower than the refractive index of a semiconductor layer. Hence, the refractive index difference is formed in a transverse direction within a resonator structure to confine the laser light in the center of the mesa, which may eventually improve luminous efficiency of the laser light. As a result, the surface-emitting layer (VCSEL) device may be capable of implementing excellent properties such as a low threshold current and high luminous efficiency.

Examples of an applied field of the VCSELs include a light source for an optical recording system in a printer (oscillation wavelength: 780 nm band), a light source for recording in an optical disk device (oscillation wavelengths: 780 nm band, 850 nm band), and a light source for an optical transmission system such as a local area network (LAN) utilizing optical fibers (oscillation wavelengths: 1.3 µm band and 1.5 µm band). Further, the VCSELs may also be applied as a light source for optical transmission between boards, within a board, between chips in a large-scale integrated circuit (LSI), or within the chip of the integrated circuit.

In the aforementioned examples of the applied field of the VCSELs, light emitted from the VCSEL (hereinafter also simply called "emission light") may preferably be directed in a certain polarization direction and preferably have a circular cross-section, and preferably be capable of emitting light orthogonal to a reference plane.

The prospective method for adjusting a polarization direction at present may be the VCSEL that employs an inclined substrate. Employing the inclined substrate in the VCSEL may make a crystal structure asymmetric relative to a main surface of the substrate. This may introduce anisotropy into optical gain. As a result, it may be possible to align the polarization in a specific direction in which the optical gain increases.

For example, Japanese Patent No. 4010095 (hereinafter referred to as "Patent Document 1") discloses a surface-emitting semiconductor laser having a relatively simple configuration that is capable of controlling polarization of laser light in a certain direction, and capable of oscillating laser light with low threshold current to exhibit high output. The surface-emitting semiconductor laser disclosed in Patent Document 1 includes a main surface of a semiconductor substrate that is crystallographically inclined at an angle range of 15 to +5 degrees in a [1 1 0] direction based on a [1 0 0] direction relative to a surface having a crystal face orientation equivalent to a [1 0 0] plane and includes an active layer formed of GaAs/AlGaAs semiconductor. The disclosed surface-emitting semiconductor laser further includes a selective oxidation layer obtained by oxidizing, from its peripheral part, a macroscopically smooth layer having a cross sectional outer circumferential shape without singularity when cut in parallel with the main surface of the semiconductor substrate.

Further, Japanese Laid-open Patent Publication No. 2010-153768 (hereinafter referred to as "Patent Document 2") discloses a surface-emitting laser device capable of exhibiting a stable polarization direction while controlling oscillation of a high-order transverse mode. The surface-emitting laser device disclosed in Patent Document 2 includes a p-side electrode formed around an emission region of an emission surface emitting laser light, and a transparent dielectric film formed in a peripheral region within the emission region to lower reflectivity of the peripheral region less than reflectivity of a central part of the emission region. In the surface-emitting laser device having the above configuration, the region having the low reflectivity within the emission region has anisotropy in two mutually orthogonal directions.

In addition, Japanese Patent No. 3566902 (herein after referred to as "Patent Document 3") discloses a surface-emitting laser device having a transparent layer relative to an oscillation wavelength of an oscillation laser formed by coating a part of an internal surface of an opening of an upper electrode. In the surface-emitting laser device, the thickness of the transparent layer is (2i+1)/4n times (n represents a refractive index of the transparent layer, i represents an integer) of the oscillation wavelength of the oscillation laser.

Moreover, Japanese Laid-open Patent Publication No. 2011-009693 (hereinafter referred to as "Patent Document 4") discloses a method for fabricating a surface-emitting laser device. The method includes layering a transparent dielectric layer on an upper surface of a layered product before forming of a mesa structure, forming a first resist pattern including a pattern regulating an outer shape of the mesa structure on the upper surface of the dielectric film and a pattern protecting a region corresponding to one of a high reflective region and a low reflective region of an emission region, etching the dielectric layer utilizing the first resist pattern as an etching mask, and forming a second resist pattern protecting a region corresponding to the entire emission region.

RELATED ART DOCUMENT

Patent Documents

Patent Document 1: Japanese Patent No. 4010095
Patent Document 2: Japanese Laid-open Patent Publication No. 2010-153768
Patent Document 3: Japanese Patent No. 3566902
Patent Document 4: Japanese Laid-open Patent Publication No. 2011-009693

In view of various kinds of applications of the surface-emitting laser device, it is important for the surface-emitting laser device to emit laser light in a direction orthogonal to a reference plane (e.g., an upper surface of a package). Note that in the present application, an emitting direction of laser light indicates a direction in which the emitted laser light exhibits the greatest radiant intensity (see FIGS. 24 to 25B).

FIG. 26A illustrates the frequency of emitting directions of laser light emitted from surface-emitting laser devices each including an inclined substrate having an inclined axis in an x-axis direction when viewed from the y-axis direction, and FIG. 26B illustrates the frequency of emitting directions of laser light emitted from the surface-emitting laser devices each including an inclined substrate having an inclined axis in an x-axis direction when viewed from the x-axis direction. As illustrated in FIGS. 26A and 26B, a large number of devices emit laser light in a direction orthogonal to a reference plane when viewed from the y-axis direction whereas a large number of devices emit laser light being inclined to a direction orthogonal to the reference plane when viewed from the x-axis direction.

Hence, the emitting directions of the laser light emitted from the surface-emitting laser devices employing the inclined substrate may emit laser light slightly inclined relative to the direction orthogonal to the reference plane. It may be difficult for the surface-emitting laser devices emitting laser light slightly inclined relative to the direction orthogonal to the reference plane to exhibit desired laser properties with stability.

SUMMARY OF THE INVENTION

It is a general object of at least one embodiment of the present invention to provide a feeding device, an image forming apparatus capable of transferring various types of tab-attached sheets without replacing the end fence, which may substantially eliminate one or more problems caused by the limitations and disadvantages of the related art.

According to one embodiment, there is provided a surface-emitting laser device that includes a lower reflector, a resonator structure having an active layer and an upper reflector layered on an inclined substrate; and an emission region enclosed by an electrode, the emission region being configured to emit laser light. In the surface-emitting laser device, the upper reflector includes a confinement structure having a current passing region enclosed by an oxide, the oxide containing at least an oxide generated as a result of partial oxidation of a layer containing aluminum subject to selective oxidation, and a dielectric film formed within the emission region, the dielectric film at least enclosing a partial region including a center of the emission region. Further, in the surface-emitting laser device, in viewing from a direction orthogonal to the emission region, a center of a region enclosed by the dielectric film is located at a position distant from the center of the emission region based on a size of the confinement structure relative to a direction orthogonal to an inclined axis of the inclined substrate.

According to one embodiment, there is provided an optical scanner device for optically scanning a scanning surface with emitting light. The optical scanner device includes a light source including the surface-emitting laser device; a deflector configured to deflect light emitted from the light source; and a scanning optical system configured to converge the light deflected by the deflector onto the scanning surface.

According to one embodiment, there is provided an image forming apparatus that includes at least one image carrier; and the optical scanner device configured to scan light modulated based on image information relative to the at least one image carrier.

Additional objects and advantages of the embodiments will be set forth in part in the description which follows, and in part will be obvious from the description, or may be learned by practice of the invention.

It is to be understood that both the foregoing general description and the following detailed description are exemplary and explanatory only and are not restrictive of the invention, as claimed.

BRIEF DESCRIPTION OF THE DRAWINGS

Other objects and further features of embodiments will be apparent from the following detailed description when read in conjunction with the accompanying drawings, in which:

FIG. 7 is a diagram illustrating an array of luminescent parts in the surface-emitting laser array;

FIGS. 9A and 9B are diagrams each illustrating a substrate of the surface-emitting laser array;

DESCRIPTION OF THE PREFERRED EMBODIMENTS

Preferred embodiments are described below with reference to the accompanying drawings.

Figure 1:
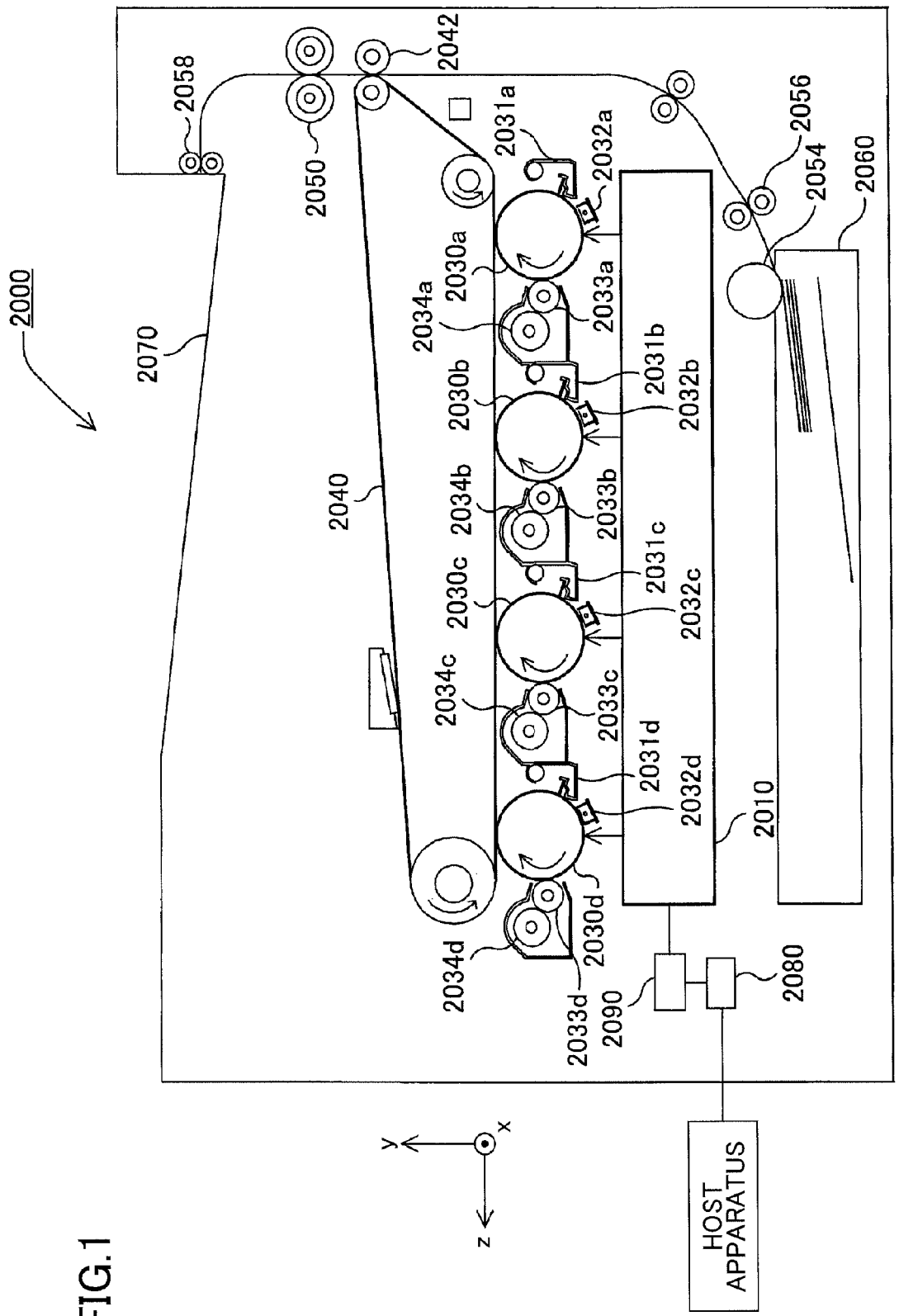
FIG. 1 is a diagram illustrating a schematic configuration of a color printer according to an embodiment.
Figure 2:
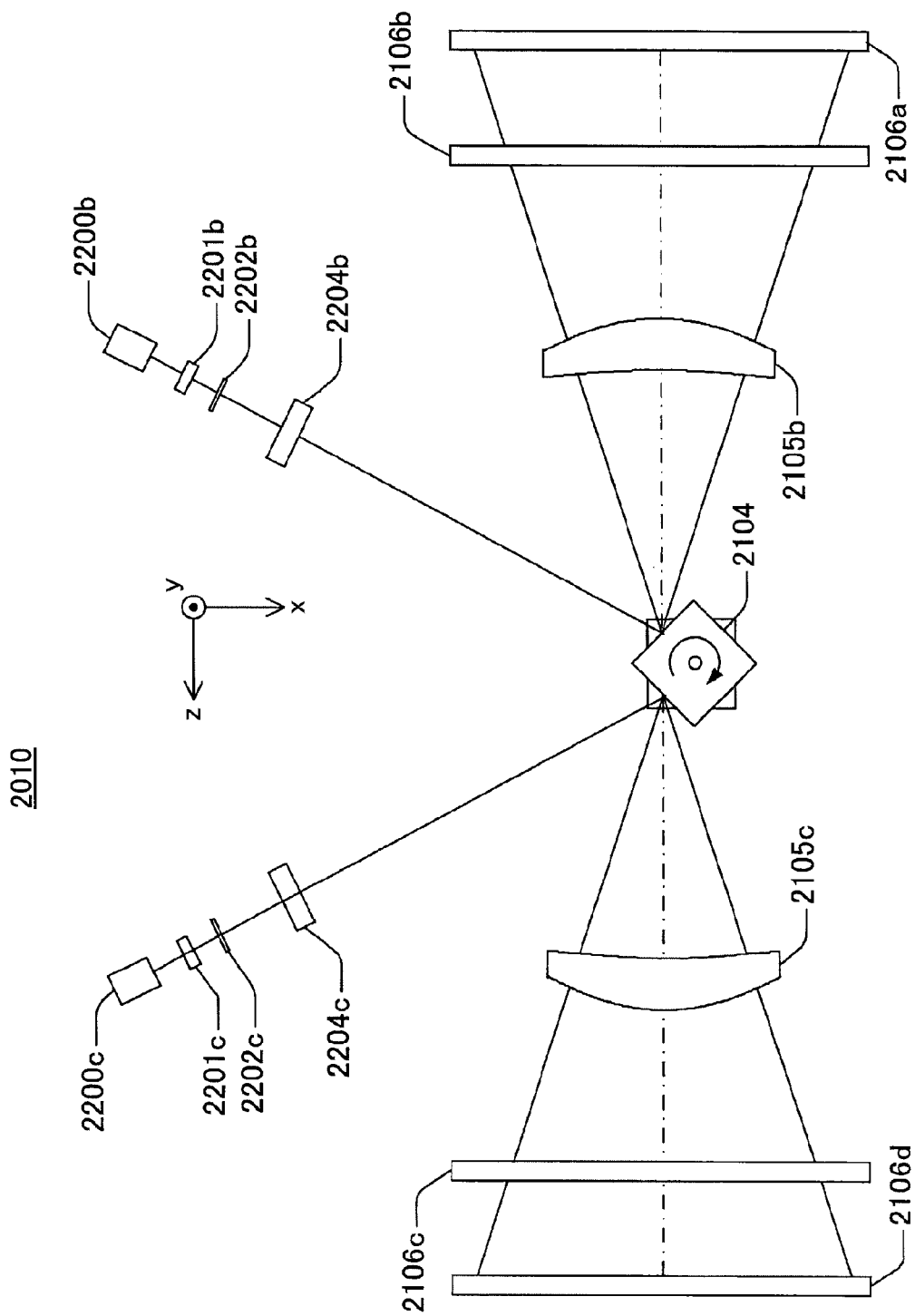
FIG. 2 is a diagram illustrating an optical scanner device in the color printer in FIG. 1.
Figure 3:
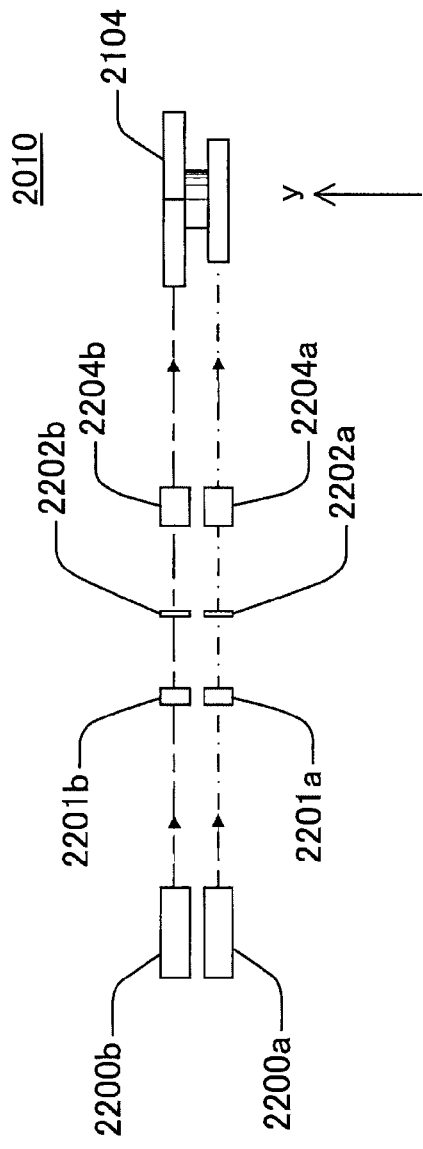
FIG. 3 is a diagram illustrating the optical scanner device in the color printer in FIG. 1.
Figure 4:
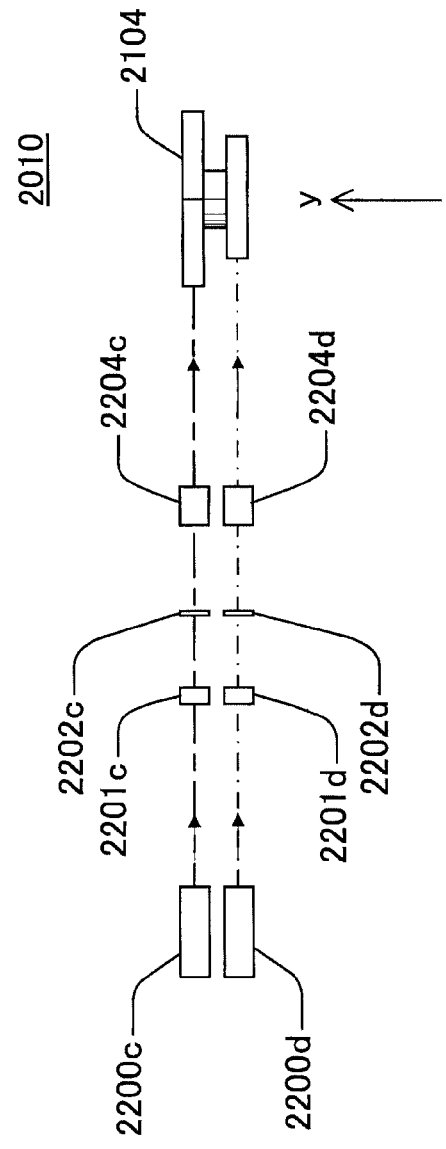
FIG. 4 is a diagram illustrating the optical scanner device in the color printer in FIG. 1.
Figure 5:
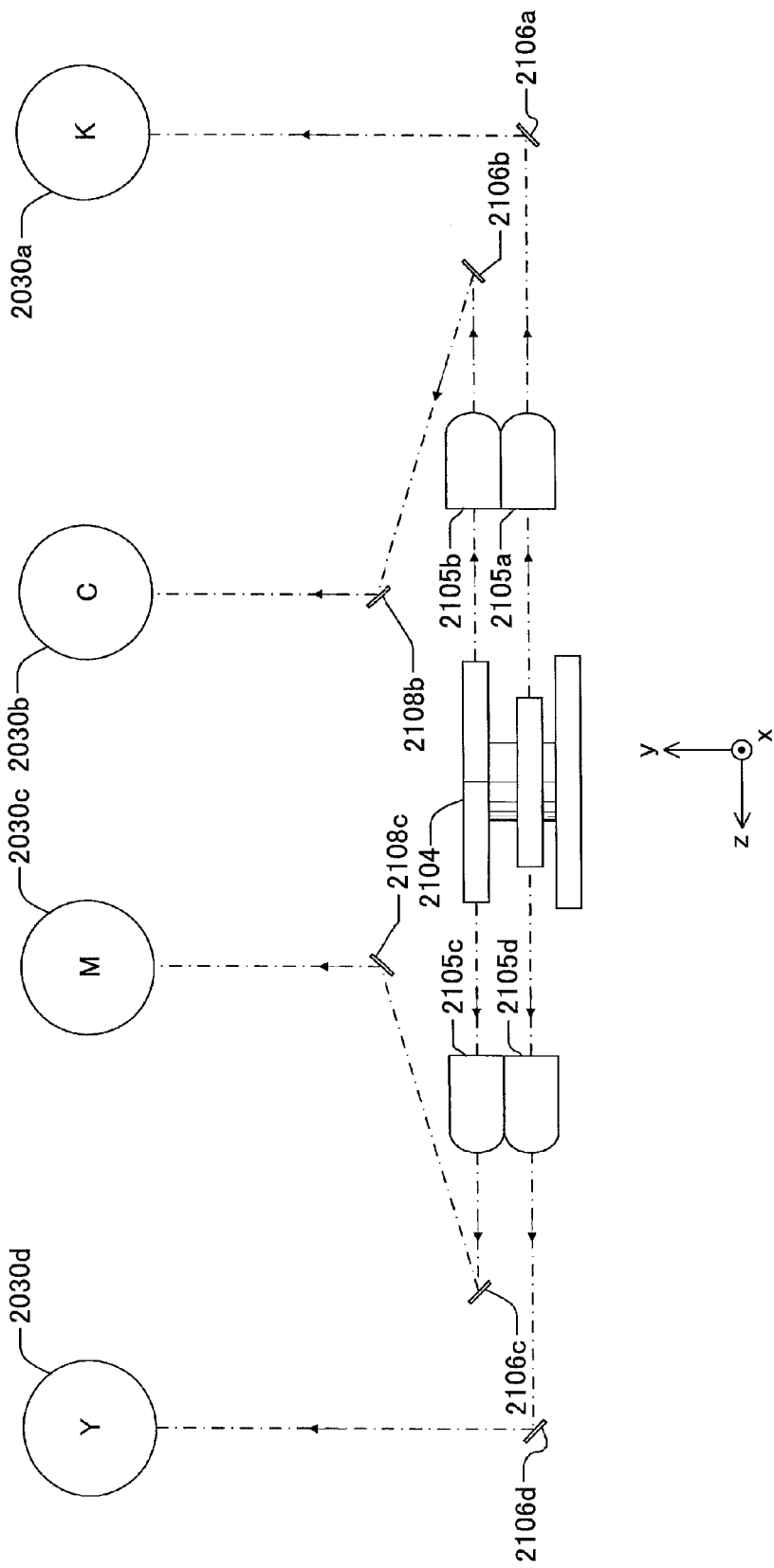
FIG. 5 is a diagram illustrating the optical scanner device in the color printer in FIG. 1.

In the following, preferred embodiments are described with reference to FIGS. 1 through 20. FIG. 1 is a schematic diagram illustrating a configuration of a color printer 2000 according to an embodiment.

The color printer 2000, which serves as an image forming apparatus, is a tandem multicolor printer configured to superimpose four colors (black, cyan, magenta and yellow) images to produce a full-color image. The color printer 2000 includes four photoreceptor drums (2030a, 2030b, 2030c and 2030d) serving as image carriers, four cleaning units (2031a, 2031b, 2031c and 2031d), four charging devices (2032a, 2032b, 2032c and 2032d), four developing rollers (2033a, 2033b, 2033c and 2033d), four toner cartridges (2034a, 2034b, 2034c and 2034d), a transfer belt 2040, a transfer roller 2042, a fixing device 2050, a paper feeding roll 2054, a resist roller pair 2056, a paper discharge roller 2058, a paper feeding tray 2060, a paper output tray 2070, a communication control device 2080 and a printer control device 2090 configured to integrally control the aforementioned components.

Note that in the following descriptions, an x-axis direction is defined as a direction along a longitudinal direction of each of the photoreceptor drums, and a z-axis direction is defined as a direction along an array direction (or arrangement direction) of the four photoreceptor drums in an xyz three-dimensional orthogonal coordinate system.

The communication control device 2080 controls bidirectional communications with a host apparatus (such as a personal computer) via a network or the like.

The printer control device 2090 includes a contral processing unit (CPU), a read-only memory (ROM) storing programs written in codes decodable by the CPU and various types of data utilized for executing the programs, a random access memory (RAM) serving as a working memory, an analog-to-digital (AD) converter circuit and the like. The printer control device 2090 reports multicolored image information (black image information, cyan image information, magenta image information and yellow image information) received from the host apparatus via the communication control device 2080 to the optical scanner device 2010.

The photoreceptor drum 2030a, the charging device 2032a, the developing roller 2033a, the toner cartridge 2034a and the cleaning unit 2031a are utilized as an assembly, which composes an image forming station configured to form a black image (hereinafter simply called a "K station" for convenience).

The photoreceptor drum 2030b, the charging device 2032b, the developing roller 2033b, the toner cartridge 2034b and the cleaning unit 2031b are utilized as an assembly, which composes an image forming station configured to form a cyan image (hereinafter simply called a "C station" for convenience).

The photoreceptor drum 2030c, the charging device 2032c, the developing roller 2033c, the toner cartridge 2034c and the cleaning unit 2031c are utilized as an assembly, which composes an image forming station configured to form a magenta image (hereinafter simply called a "M station" for convenience).

The photoreceptor drum 2030d, the charging device 2032d, the developing roller 2033d, the toner cartridge 2034d and the cleaning unit 2031d are utilized as an assembly, which composes an image forming station configured to form a yellow image (hereinafter simply called a "Y station" for convenience).

Each of the photoreceptor drums 2030 has a photosensitive layer on its surface. That is, the surfaces of the photoreceptor drums 2030 are subject to scanning. Note that the photoreceptor drums 2030 are configured to rotate by a not-illustrated rotational mechanism in directions indicated by arrows in FIG. 1.

The charging devices 2032 are configured to uniformly charge respective surfaces of the photoreceptor drums 2030.

The optical scanner device 2010 is configured to scan the charged surfaces of the photoreceptor drums 2030 by luminous flux modulated for corresponding colors based on the multicolored image information acquired from the printer control device 2090. Hence, electric charges dissipate only from light exposed parts of the surfaces of the photoreceptor drums 2030 such that latent images corresponding to the image information are formed on the respective surfaces of the photoreceptor drums 2030. The latent images formed on the surfaces of the photoreceptor drums 2030 travel along with the rotation of the photoreceptor drums 2030 in directions toward the corresponding developing rollers 2032. Note that a configuration of the optical scanner device 2010 will be described later.

Toner from the corresponding toner cartridges is uniformly applied to the surfaces of the developing rollers 2033 while rotating such that thin toner layer are uniformly formed on the surfaces of the developing rollers 2033. The toner applied to the surfaces of the developing rollers 2033 are then transferred to the light exposed parts of the surfaces of the photoreceptor drums 2030 and the transferred toner is then attached to the light exposed parts of the surfaces of the photoreceptor drums 2030 while the toner is brought into contact with the surfaces of the photoreceptor drums 2030. That is, the developing rollers 2033 apply toner to the latent images formed on the surfaces of the corresponding photoreceptor drums 2030 to make the latent images visible on the surfaces of the photoreceptor drums 2030. Note that the toner applied latent images (hereinafter also called "toner images" for convenience) travel along with the rotation of the photoreceptor drums 2030 in a direction toward the transfer belt 2040.

The toner images of respective colors of yellow, magenta, cyan and black are sequentially transferred to the transfer belt 2040 at predetermined timing so as to superimpose the respective toner images. As a result, a color image is formed on the transfer belt 2040.

The paper feeding tray 2060 stores sheets of recording paper. The paper feeding roll 2054 is arranged near the paper feeding tray 2060 so as to pick one sheet of the recording paper (hereinafter simply called a "recording sheet") from the paper feeding tray 2060 and transfer the picked recording sheet to the resist roller pair 2056. The resist roller pair 2056 transfers the recording sheet to an interval between the transfer belt 2040 and the transfer roller 2042 at predetermined timing. As a result, the color image on the transfer belt 2040 is transferred onto the recording sheet. The recording sheet onto which the color image is transferred is conveyed to the fixing device 2050.

The fixing device 2050 applies heat and pressure to the recording sheet so as to fix the toner to the recording sheet. The recording sheet to which the toner is fixed is conveyed to the paper output tray 2070 via the discharge roller 2058 and sequentially stacked on the paper output tray 2070.

Each of the cleaning units 2031 is configured to remove remaining toner (residual toner) from the surface of the corresponding one of the photoreceptor drums 2030. The surface of the corresponding photoreceptor drum 1030 from which the residual toner is removed returns to a position that faces the corresponding charging device 2032.

Next, the configuration of the optical scanner device 2010 is described.

As illustrated in FIGS. 2 to 5, the optical scanner device 2010 includes four light sources (2200a, 2200b, 2200c and 2200d), four coupling lenses (2201a, 2201b, 2201c and 2201d), four apertured plates (2202a, 2202b, 2202c and 2202d), four cylindrical lenses (2204a, 2204b, 2204c and 2204d), an optical deflector 2104, four scanning lenses (2105a, 2105b, 2105c and 2105d), six turning mirrors (2106a, 2106b, 2106c, 2106d, 2108b and 2108c), a not-illustrated scanning control device and the like.

Note that a direction corresponding to a main-scanning direction is hereinafter called a "main-scanning equivalent direction", and a direction corresponding to a sub-scanning direction is called a "sub-scanning equivalent direction" for convenience.

The light source 2200a, the coupling lens 2201a, the apertured plate 2202a, the cylindrical lens 2204a, the scanning lens 2105a and the turning mirror 2106a serve as an optical member for forming a latent image on the surface of the photoreceptor drum 2030a.

The light source 2200b, the coupling lens 2201b, the apertured plate 2202b, the cylindrical lens 2204b, the scanning lens 2105b, the turning mirror 2106b and the turning mirror 2108b serve as an optical member for forming a latent image on the surface of the photoreceptor drum 2030b.

The light source 2200c, the coupling lens 2201c, the apertured plate 2202c, the cylindrical lens 2204c, the scanning lens 2105c, the turning mirror 2106c and the turning mirror 2108c serve as an optical member for forming a latent image on the surface of the photoreceptor drum 2030c.

The light source 2200d, the coupling lens 2201d, the apertured plate 2202d, the cylindrical lens 2204d, the scanning lens 2105d and the turning mirror 2106d serve as an optical member for forming a latent image on the surface of the photoreceptor drum 2030d.

Each of the coupling lenses 2201 is arranged in an optical path of the luminous flux emitted from the corresponding light source 2200 to make the luminous flux an approximately parallel luminous flux.

Each of the apertured plates 2202 has an aperture so that the apertured plate 2202 adjusts the luminous flux via the corresponding coupling lens 2201.

Each of the cylindrical lenses 2204 converges the luminous flux having passed through the corresponding apertured plate 2202 to form an image relative to the y-axis direction near deflection reflecting surfaces of the optical deflector 2104.

The optical deflector 2104 includes two-staged polygon mirrors. Each of the two-staged polygon mirrors includes four deflection reflecting surfaces. The first stage (lower stage) of the polygon mirror deflects the luminous flux from the cylindrical lens 2204a and the luminous flux from the cylindrical lens 2204b. The second stage (upper stage) of the polygon mirror deflects the luminous flux from the cylindrical lens 2204b and the luminous flux from the cylindrical lens 2204c. Note that the first stage and the second stage of the polygon mirrors rotate with a phase of the first stage being shifted from a phase of the second stage by approximately 45 degrees.

The luminous flux from the cylindrical lens 2204a deflected by the optical deflector 2104 is applied to the photoreceptor drum 2030a via the scanning lens 2105a and the turning mirror 2106a so as to form an optical spot. The optical spot travels with the rotation of the optical deflector 2104 in a longitudinal direction of the photoreceptor drum 2030a.

Likewise, the luminous flux from the cylindrical lens 2204b deflected by the optical deflector 2104 is applied to the photoreceptor drum 2030b via the scanning lens 2105b and the two turning mirrors 2106b and 2108b so as to form an optical spot. The optical spot travels with the rotation of the optical deflector 2104 in a longitudinal direction of the photoreceptor drum 2030b.

Similarly, the luminous flux from the cylindrical lens 2204c deflected by the optical deflector 2104 is applied to the photoreceptor drum 2030c via the scanning lens 2105c and the two turning mirrors 2106c and 2108c so as to form an optical spot. The optical spot travels with the rotation of the optical deflector 2104 in a longitudinal direction of the photoreceptor drum 2030c.

Likewise, the luminous flux from the cylindrical lens 2204d deflected by the optical deflector 2104 is applied to the photoreceptor drum 2030d via the scanning lens 2105d and the turning mirror 2106d so as to form an optical spot. The optical spot travels with the rotation of the optical deflector 2104 in a longitudinal direction of the photoreceptor drum 2030d.

Note that a traveling direction of the optical spot on each of the photoreceptor drums 2030 corresponds to a "main-scanning direction" whereas a rotational direction of each of the photoreceptor drums 2030 corresponds to a "sub-scanning direction".

An optical system arranged in an optical path between the optical deflector 2104 and each of the photoreceptor drum 2030 may also be called a "scanning optical system".

Figure 6:
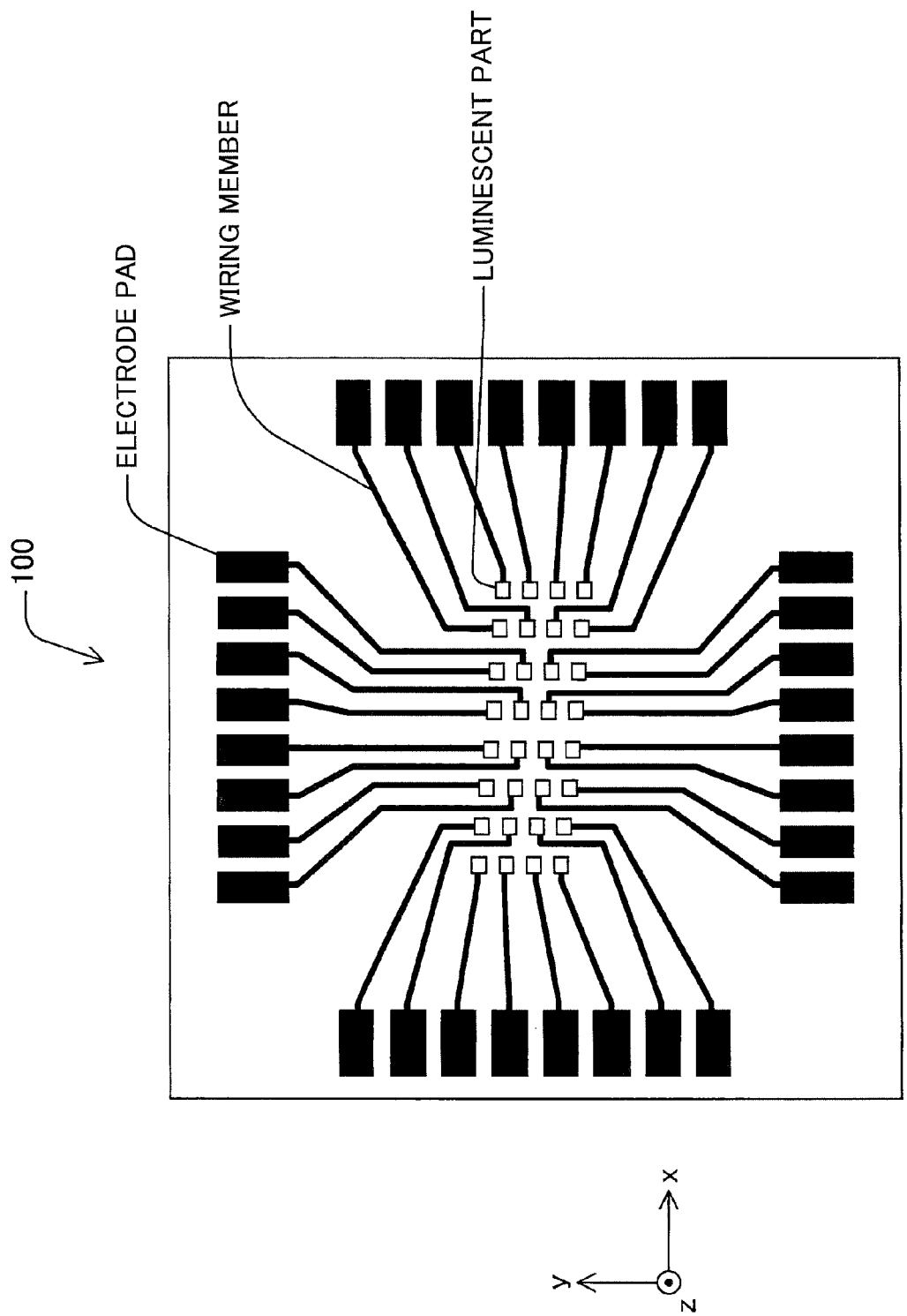
FIG. 6 is a diagram illustrating a surface-emitting laser array.

Each of the light sources includes a surface-emitting laser array 100 composed of 32 luminescent parts that are arranged two-dimensionally (See FIG. 6). In this configuration, a z-axis direction is defined as a laser oscillation direction, and the x-axis and y-axis directions are defined as two directions mutually orthogonal to the z-axis direction within a surface of the surface-emitting laser array.

As illustrated in FIG. 7, 32 luminescent parts are arranged at equal intervals (i.e., indicated by "d1" in FIG. 7) in a condition where all the luminescent parts are orthogonally projected in a virtual line extending in the x-axis direction. Note that in this specification, a "luminescent part interval" is defined as a center-to-center distance between the two luminescent parts.

Figure 8A:
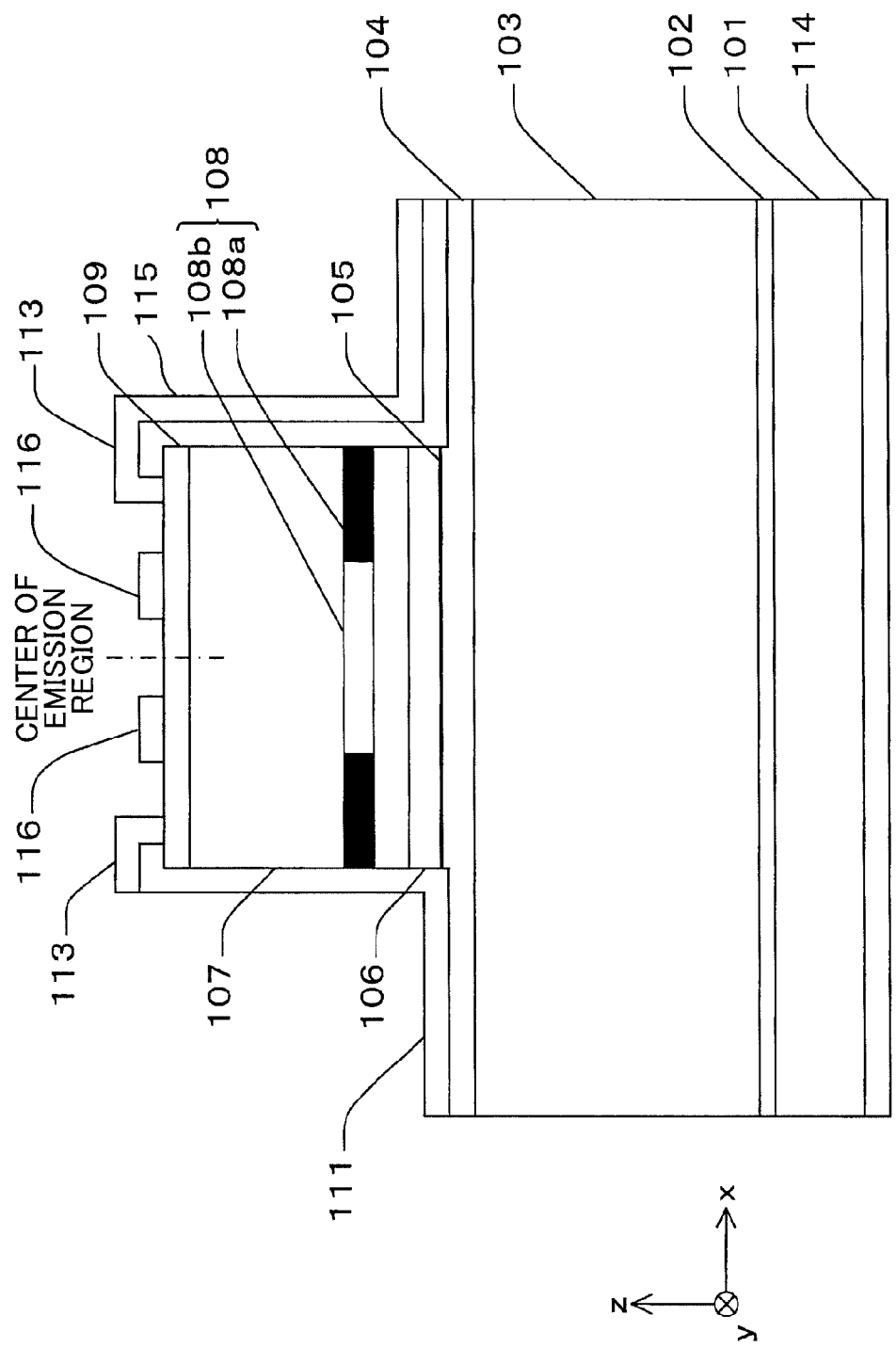
FIGS. 8A and 8B are diagrams each illustrating a configuration of the luminescent part.
Figure 8B:
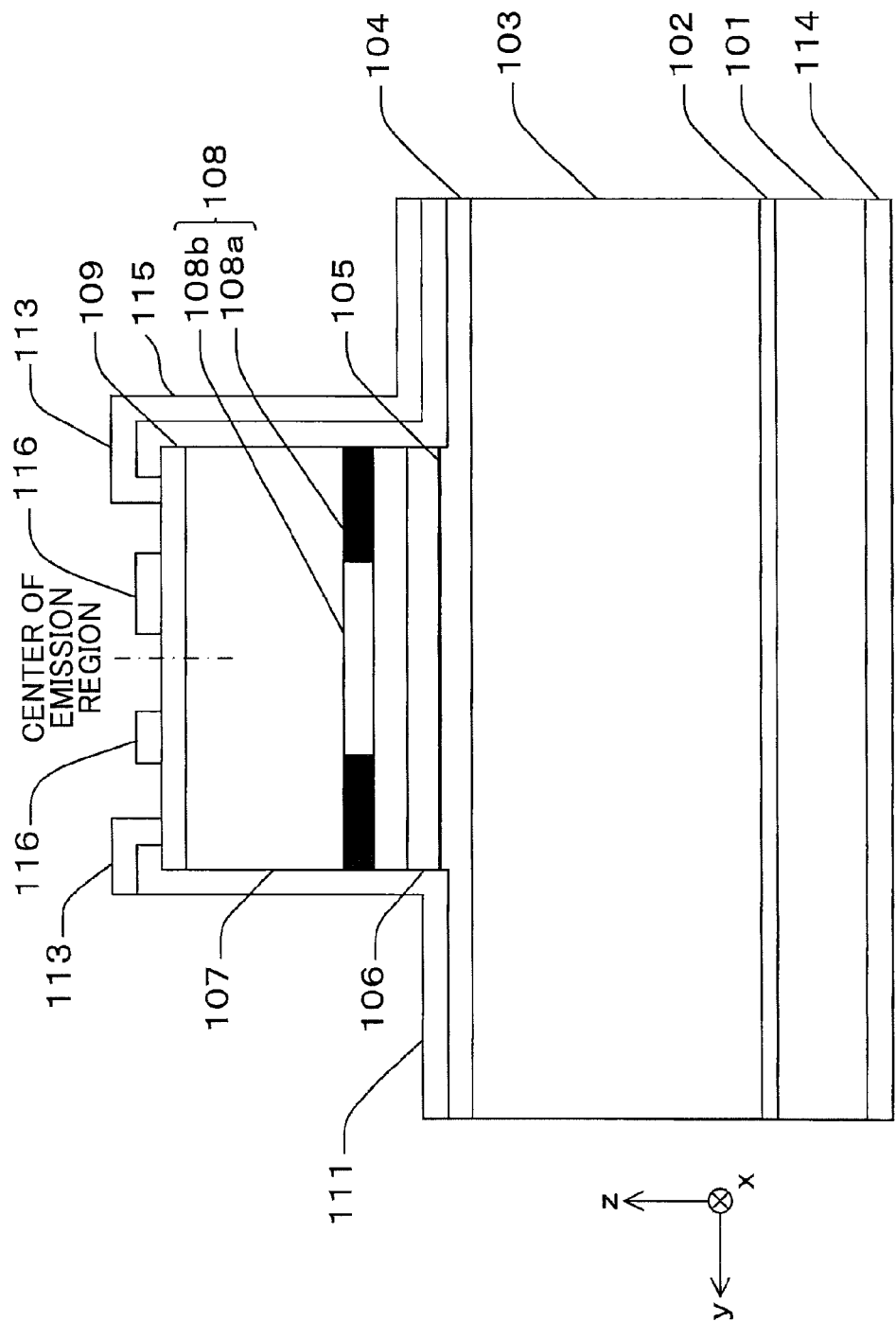

Note that FIG. 8A is a cross sectional diagram illustrating one luminescent part sectioned in parallel with an xz plane, and FIG. 8B is a cross sectional diagram illustrating the luminescent part sectioned in parallel with a yz plane.

Each of the luminescent parts is a surface-emitting layer that has an oscillation wavelength of 780 nm band, and is configured to include a substrate 101, a buffer layer 102, a lower semiconductor DBR 103, a lower spacer layer 104, an active layer 105, an upper spacer layer 106, an upper semiconductor DBR 107, an upper electrode 113, a lower electrode 114, a wiring member 115, and a dielectric film 116.

As illustrated in FIG. 9A, the substrate 101 has a mirror polishing surface (a main surface). The substrate 101 is an n-GaAs mono-crystal substrate, a normal line direction of which is inclined at 15 degrees (θ=15) toward a crystal orientation [1 1 1] A direction relative to a crystal orientation [1 0 0] direction. That is, the substrate 101 is a so-called "inclined substrate". Note that as illustrated in FIG. 9B, the substrate 101 is arranged such that the crystal orientation [0 −1 1] direction of the substrate 101 is a +x direction and the crystal orientation [0 1 −1] direction of the substrate 101 is a −x direction. Hence, an inclined axis of the inclined substrate is parallel to the x-axis direction. Note that −y direction may also be called an "inclined direction".

Further, in this configuration, the use of the inclined substrate as the substrate 101 may provide a polarization adjusting function to stabilize the polarization direction in the x-axis direction.

Referring back to FIGS. 8A and 8B, the buffer layer 102 is formed of an n-GaAs layer and layered on the surface of the substrate 101 in a +z direction.

The lower semiconductor DBR 103 is layered on a surface of the buffer layer 102 in the +z direction. The lower semiconductor DBR 103 has 42.5 pairs of refractive index layers each having a low refractive index layer made of an n-$Al_{0.93}Ga_{0.07}As$ and a high refractive index layer made of an n-$Al_{03}Ga_{0.7}As$. A composition gradient layer having a thickness of 20 nm is provided between the low refractive index layer and the high refractive index layer for reducing electric resistance. Note that a ratio of one composition to the other in the composition gradient layer gradually changes. Each of the low refractive index layer and the high refractive index layer is arranged such that the corresponding refractive index layer includes a half of the adjacent composition gradient layer, and an optical thickness of the corresponding refractive index layer is set as $\lambda/4$ provided that the oscillation wavelength is determined as $\lambda$. Note that if the optical thickness is determined as $\lambda/4$, an actual thickness D of the corresponding layer is $D=\lambda/4n$. Note that n represents a refractive index of a medium of that layer.

The lower spacer layer 104 is layered on a surface of the lower semiconductor DBR 103 in the +z direction. The lower spacer layer 104 is formed of an undoped layer made of $Al_{0.33}Ga_{0.67}As$.

The active layer 105 is layered on a surface of the lower spacer layer 104 in the +z direction. The active layer 105 is formed of GaInAsP/$Al_{0.33}Ga_{0.67}As$ having a triple quantum well structure.

The upper spacer layer 106 is layered on a surface of the active layer 105 in the +z direction. The upper spacer layer 106 is formed of an undoped layer made of $Al_{0.33}Ga_{0.67}As$.

A part composed of the lower spacer layer 104, the active layer 105 and the upper spacer layer 106 may also be called a "resonator structure". The resonator structure is configured to include a half of the adjacent composition gradient layer such that an optical thickness of the resonator structure is formed as 1 wavelength. The active layer 105 is provided at a center of the resonator structure located corresponding to a position of a loop of a standing wave distribution of the electric field so as to obtain a highly induced stimulated emission probability.

The upper semiconductor DBR 107 is layered on a surface of the upper spacer layer 106 in the +z direction. The upper semiconductor DBR 107 has 32 pairs of a low refractive index layer made of p-$Al_{0.93}Ga_{0.07}As$ and a high refractive index layer made of p-$Al_{0.33}Ga_{0.67}As$. A composition gradient layer is provided between the low refractive index layer and the high refractive index layer. Each of the low refractive index layer and the high refractive index layer is arranged such that the corresponding refractive index layer includes a half of the adjacent composition gradient layer, and an optical thickness of the corresponding refractive index layer is set as $\lambda/4$.

A selective oxidation layer made of p-$Al_{0.99}Ga_{0.01}As$ and having a thickness of 30 nm is inserted into one of the low refractive index layers of the upper semiconductor DBR 107. More specifically, the selective oxidation layer is inserted into the refractive index layer of the second pair from the upper spacer layer 106.

The contact layer 109 is made of p-GaAs. The contact layer 109 is layered on a surface of the upper semiconductor DBR 107 in the +z direction.

Note that a product obtained by layering two or more semiconductor layers on the substrate 101 is simply called a "layered product".

Next, a method for fabricating the surface-emitting laser array 100 is described.

Figure 10:
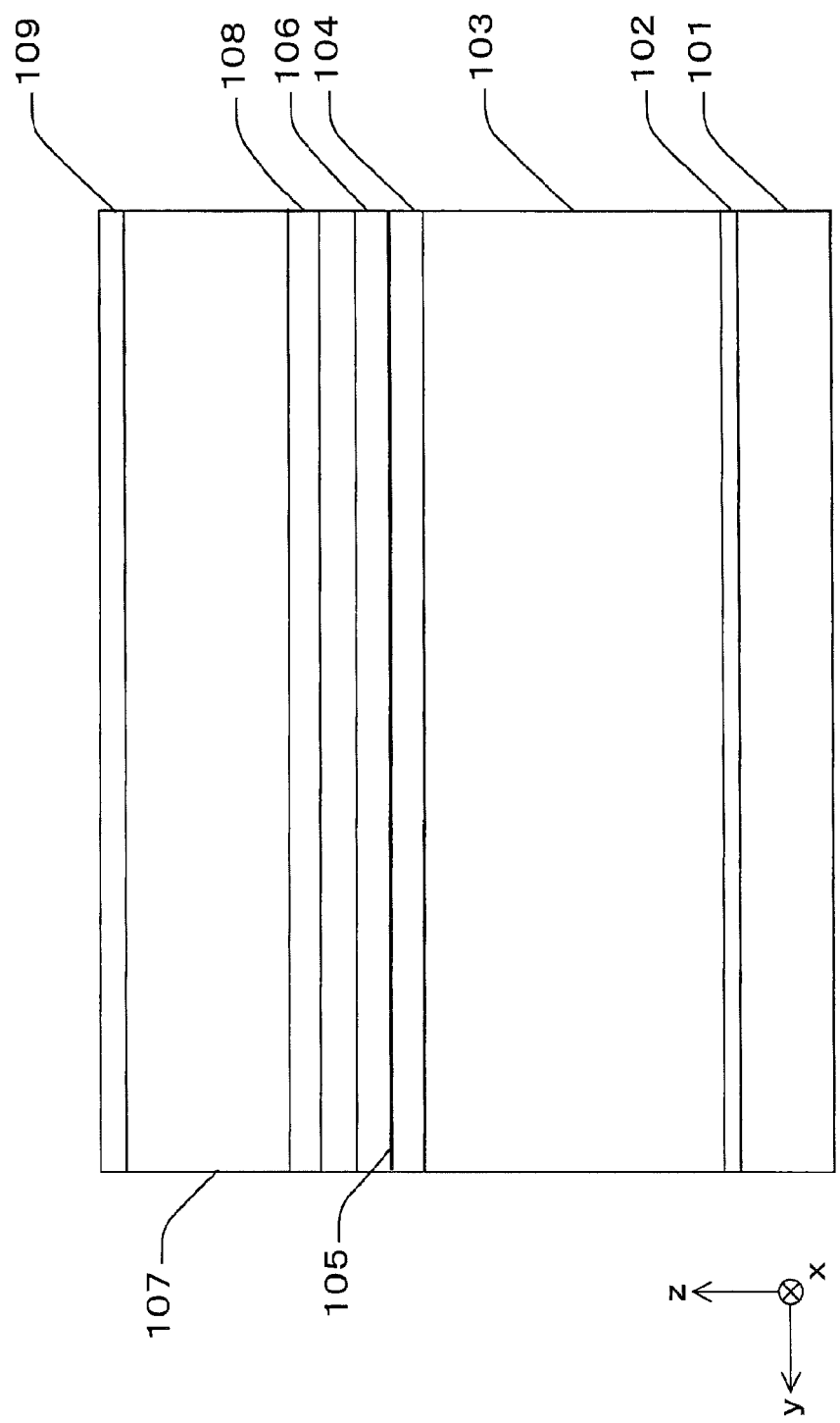
FIG. 10 is a diagram illustrating a method for fabricating the surface-emitting laser array.

Process 1: The aforementioned layered product is formed by crystal growth by metal organic chemical vapor deposition (MOCVD) or molecular beam epitaxy (MBE) as illustrated in FIG. 10.

In this process, trimethylaluminum, trimethylgallium (TMG), and trimethylindium (TMI) are used as raw materials for III-Group, and phosphine ($PH_3$) and arsine ($AsH_3$) are used as raw materials for V-Group. In addition, carbon tetrabromide ($CBr_4$) and dimethylzinc (DMZn) are used as p-type dopant materials, and hydrogen selenide ($H_2Se$) is used as an n-type dopant material.

Process 2: A square resist pattern having 25 μm on a side corresponding to a desired mesa shape is formed on the surface of the layered product.

Process 3: a square pillar-shaped mesa is formed by inductively-coupled plasma (ICP) dry etching utilizing the aforementioned square resist pattern as a photomask. In this process, a bottom surface for etching is located in the lower spacer layer 104.

Figure 11:
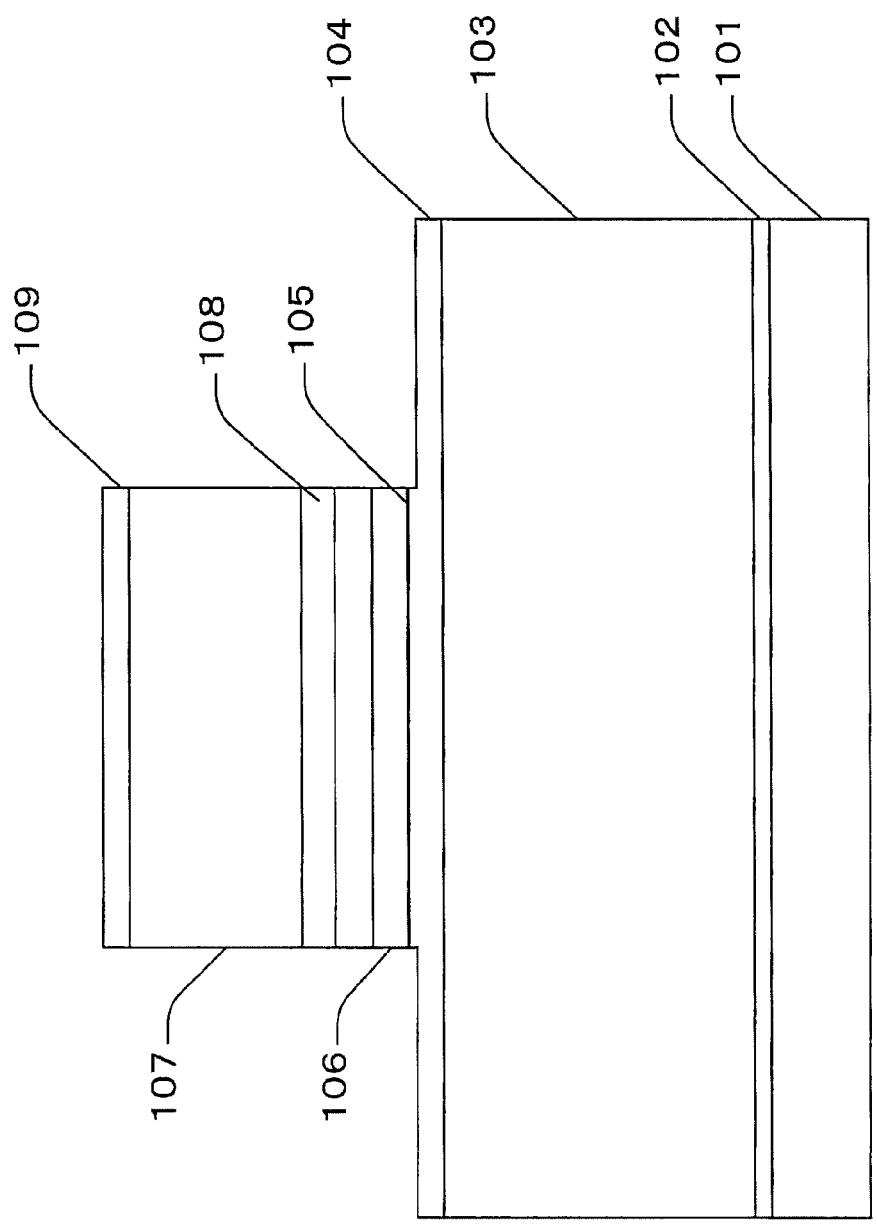
FIG. 11 is a diagram illustrating the method for fabricating the surface-emitting laser array.

Process 4: The photomask is removed as illustrated in FIG. 11.

Figure 12:
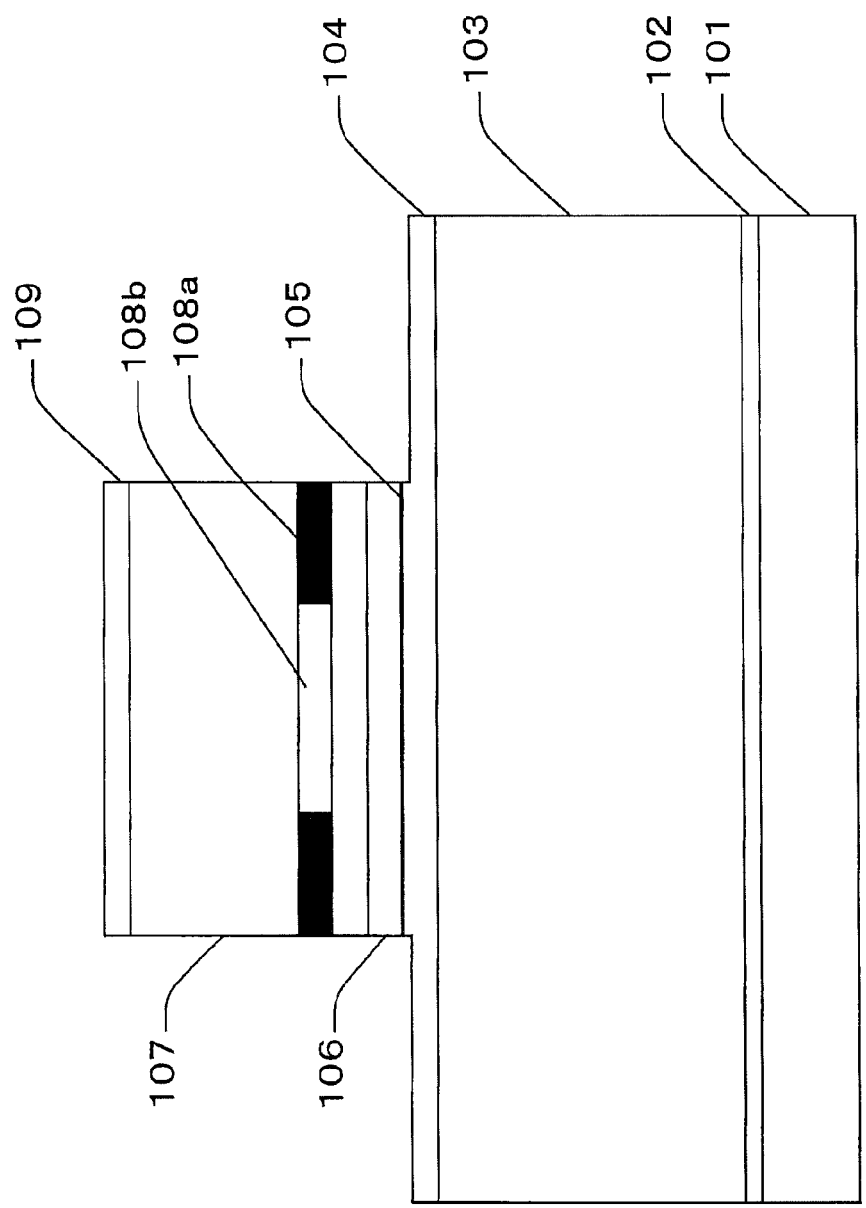
FIG. 12 is a diagram illustrating the method for fabricating the surface-emitting laser array.

Process 5: The resulting layered product is heat-treated with water vapor. In this process, aluminum (Al) of the selective oxidation layer 108 is selectively oxidized from an outer periphery of the mesa. Then, an unoxidized region 108b enclosed by an Al oxide layer 108a remains at a central part of the mesa as illustrated in FIG. 12. As a result, an oxide confinement structure configured to restrict a path for the drive current of a luminescent part only to a path formed in the central part of the mesa. Note that the aforementioned unoxidized region 108b corresponds to the current passing region (also referred to as a "current injection region"). The current passing region (current injection region) 108b has an approximately square shape having a length of approximately 5.4 μm on a side.

Process 6: A resist mask for forming a separation groove (along which the chip is cut) is formed on the surface of the layered product.

Process 7: The separation groove (along which the chip is cut) is formed on the surface of the layered product by dry etching utilizing the aforementioned resist mask as an etching mask.

Figure 13:
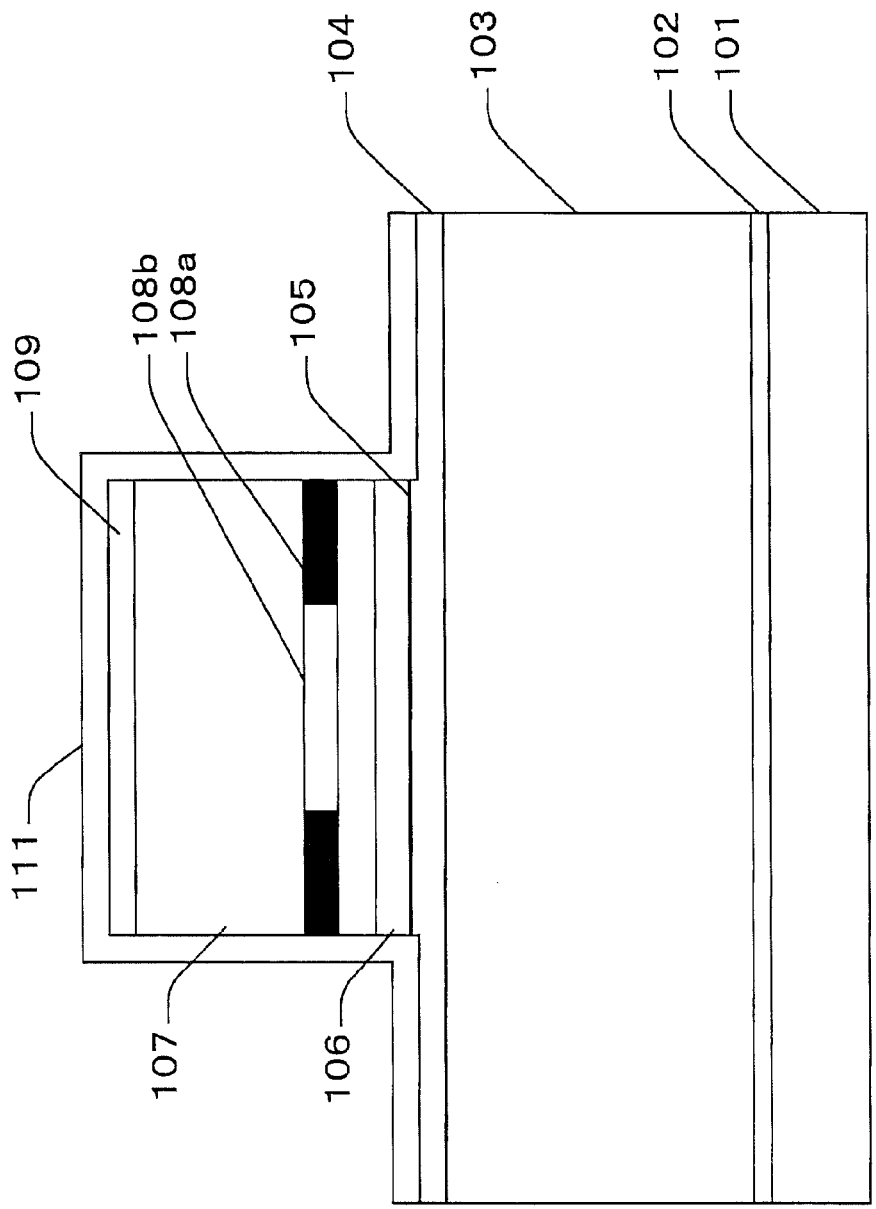
FIG. 13 is a diagram illustrating the method for fabricating the surface-emitting laser array.

Process 8: A protective layer 111 made of SiN is formed by chemical vapor deposition (CVD) as illustrated in FIG. 13. In this process, an optical thickness of the protection layer 111 is set as $\lambda/4$. Specifically, since a refractive index n of SiN is 1.86 and an oscillation wavelength λ is 780 nm, the actual film thickness (=λ/4 n) of the protection layer 111 is set as approximately 105 nm.

Figure 14:
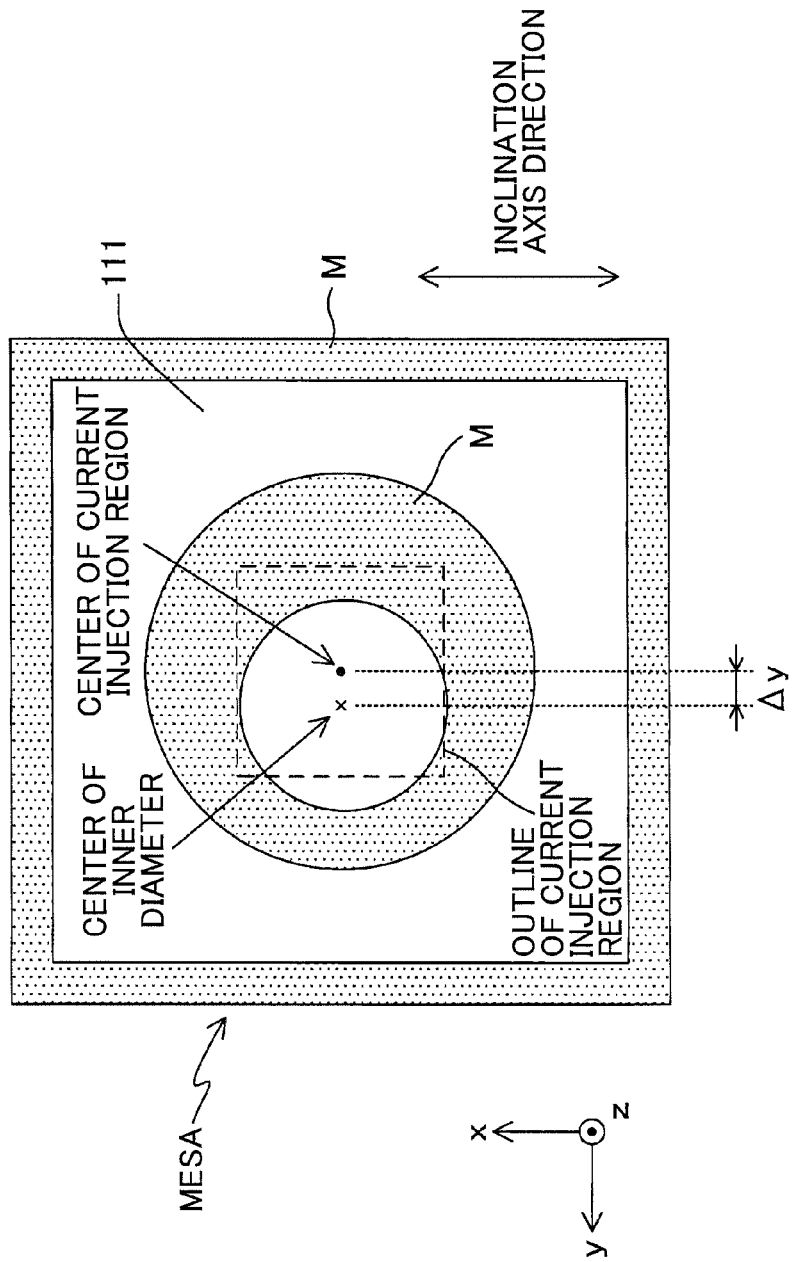
FIG. 14 is a diagram illustrating a mask M.
Figure 15:
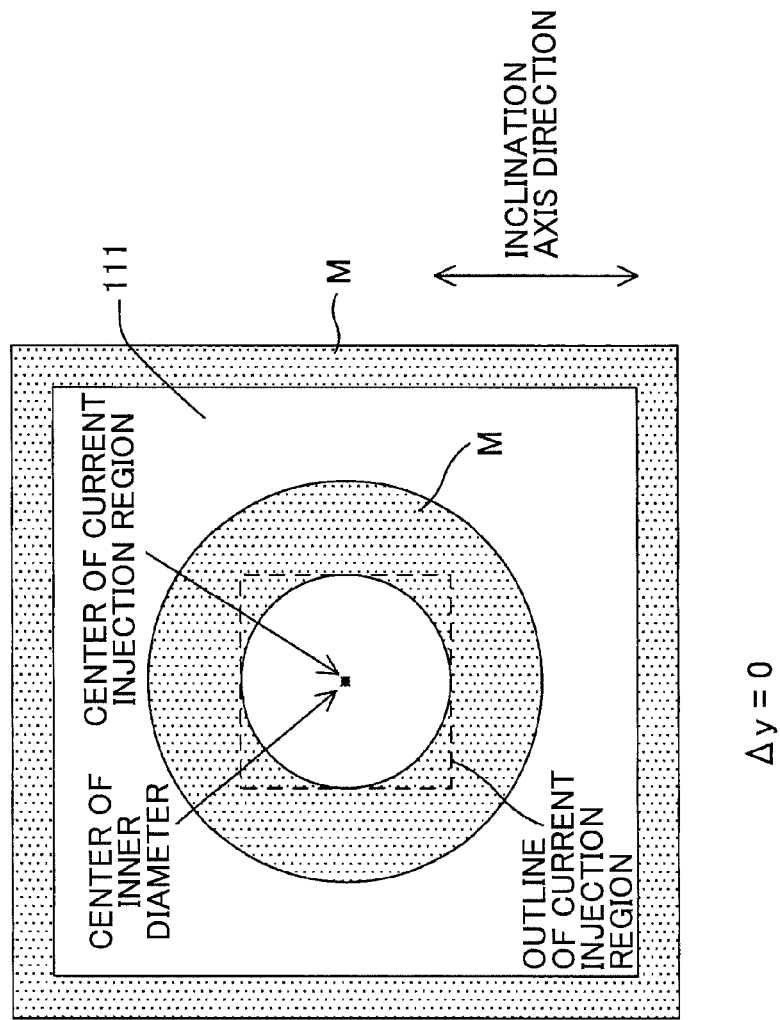
FIG. 15 is a diagram illustrating a mask M utilized in a related art surface-emitting laser array.

Process 9: An etching mask for forming an opening (hereinafter also called a "mask M") is formed on an upper side of the mesa serving as a laser emitting surface. In this process, the mask M is formed so as to not to etch the periphery of the upper surface of the mesa and a ring region of the upper surface of the mesa. As an example, an inner diameter and an outer diameter of the ring region are determined as 4 μm and 8 μm, respectively. Further, a center of the inner diameter of the ring region in this example is shifted by Δy (i.e., Δy=0.2 μm in this example) from a center of the current passing region 108b toward +y direction as illustrated in FIG. 14. Note that the center of the current passing region 108b indicates an intersection of two diagonal lines in the current passing region 108b. Note that in the related art surface-emitting laser array, Δy is set as Δy=0, as illustrated in FIG. 15.

Process 10: The protective layer 111 is etched with a buffered hydrofluoric acid (BHF).

Figure 16A:
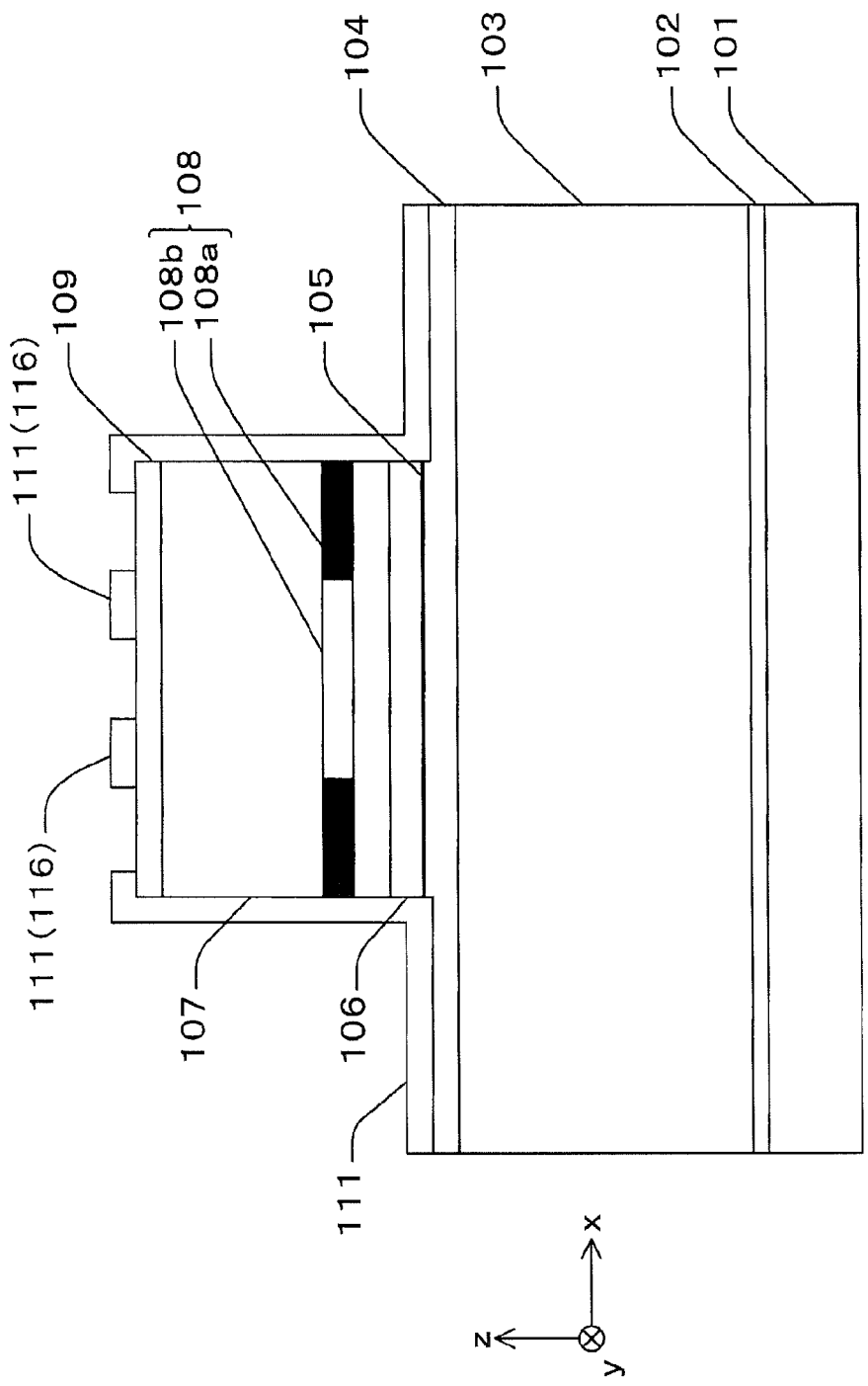
FIGS. 16A and 16B are diagrams illustrating a method for fabricating the surface-emitting laser array.
Figure 16B:
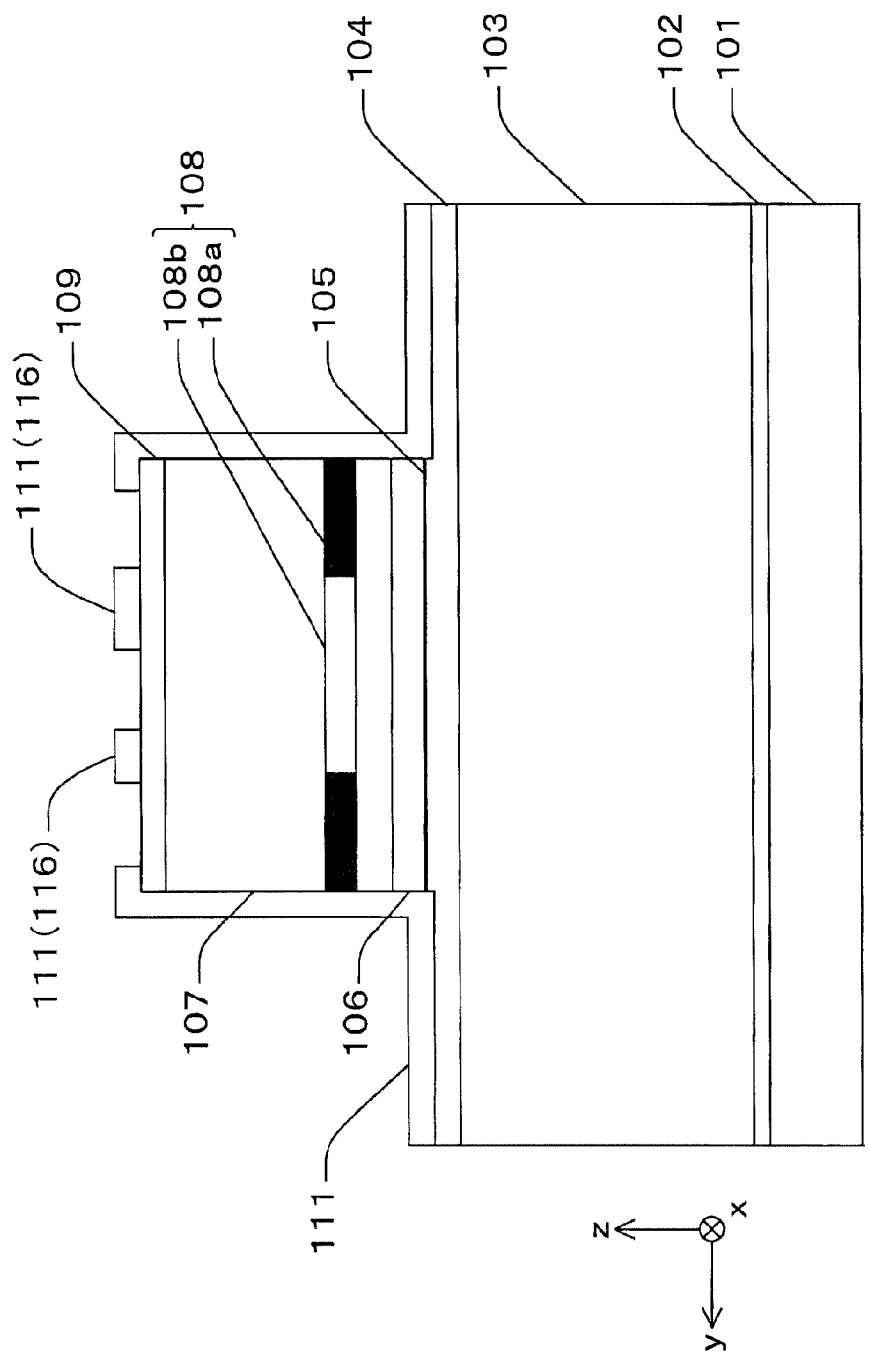

Process 11: The masks M are then removed as illustrated in FIGS. 16A and 16B. Note that the protective layer 111 remaining in a region corresponding to an opening of the upper electrode 113 serves as the dielectric film 116. The dielectric film 116 serves as a function to decrease the reflectivity of the peripheral part of the upper surface of the mesa compared to the central part of the upper surface of the mesa. That is, the dielectric film 116 serves as a function to decrease the reflectivity of the peripheral part of the upper surface of the mesa such that reflectivity of the peripheral part within a laser emitting region of the upper surface of the mesa is lower than reflectivity of the central part of the upper surface of the mesa.

Process 12: A square resist pattern having 10 μm on a side is formed such that a center of the square resist pattern approximately matches the center of the upper surface of the mesa to thereby deposit a p-side electrode material. As an electrode material, a multilayer film of Cr/AuZn/Au or a multilayer film of Ti/Pt/Au may be used.

Figure 17:
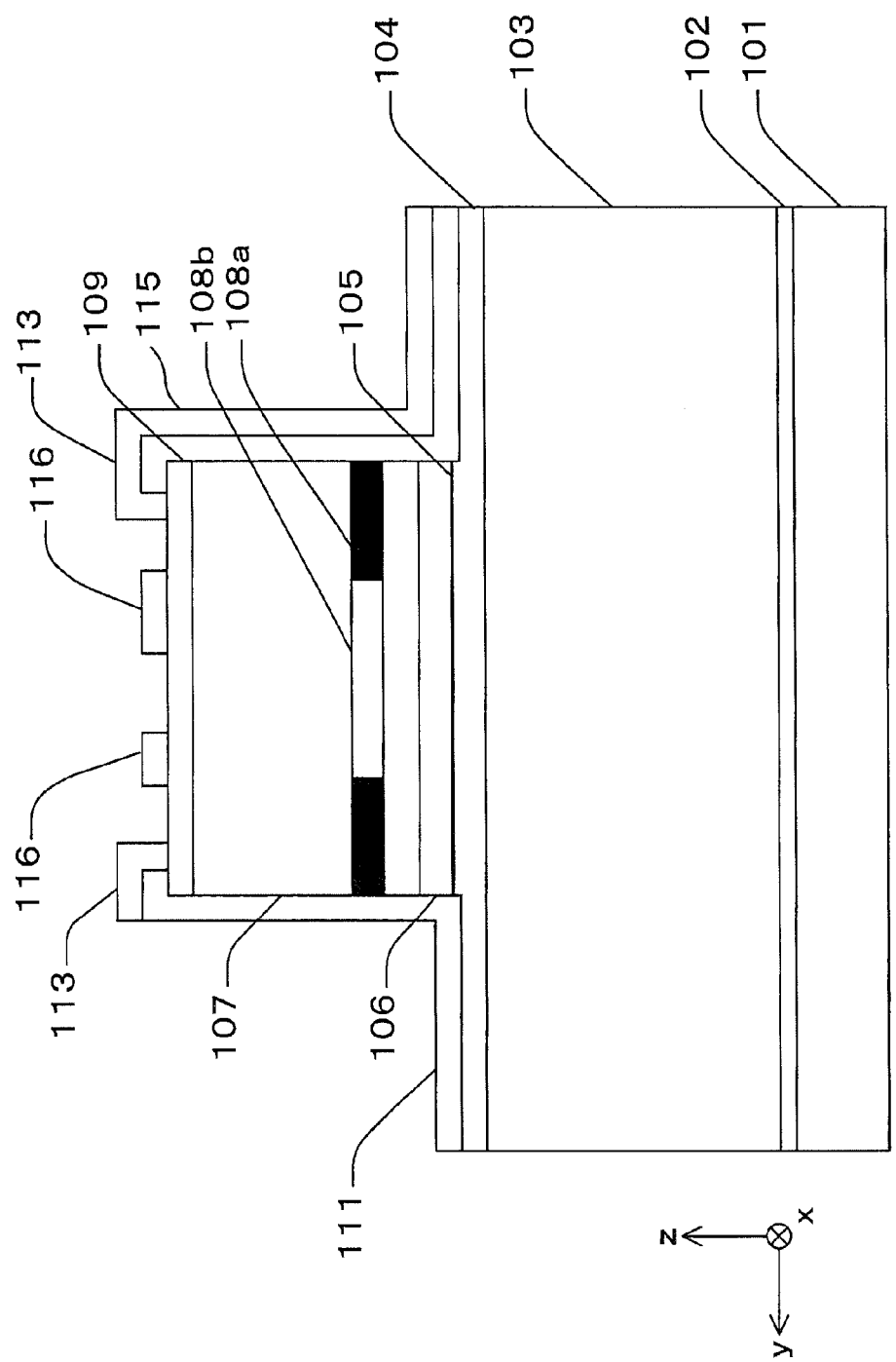
FIG. 17 is a diagram illustrating the method for fabricating the surface-emitting laser array.
Figure 18:
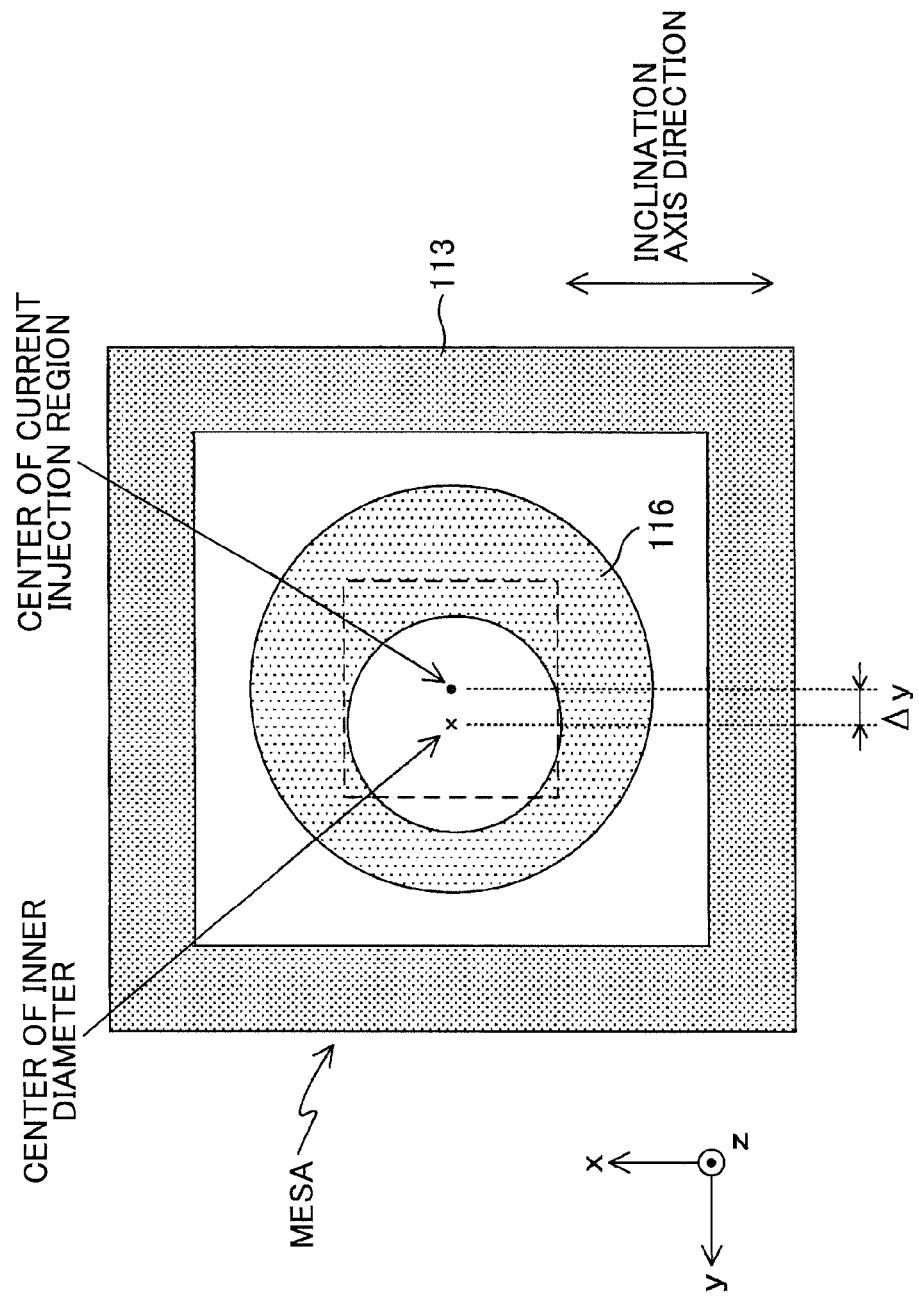
FIG. 18 is a plan diagram illustrating a mesa in FIG. 17.
Figure 19:
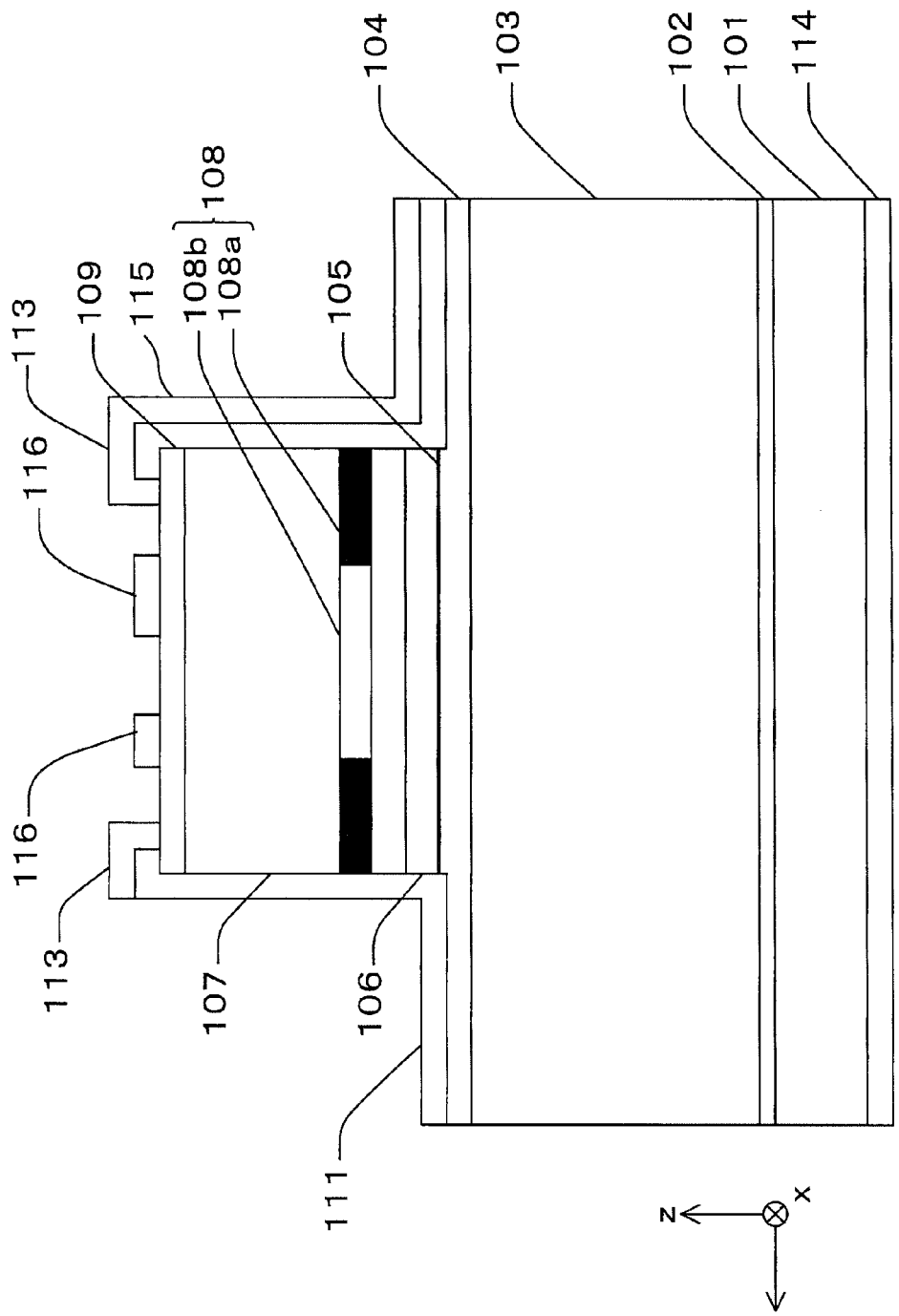
FIG. 19 is a diagram illustrating the method for fabricating the surface-emitting laser array.

Process 13: The electrode material deposited on the square resist pattern is lifted off so as to form the upper electrode 113 as illustrated in FIGS. 17 and 18. The region enclosed by the upper electrode 113 corresponds to the emission region. A center of the emission region matches the center of the upper surface of the mesa. Note that a center of an inner diameter of the dielectric film 116 in this example is shifted by Δy (i.e., Δy=−0.2 μm in this example) from a center of the emission region toward −y direction.

Process 14: The backside of the substrate 101 is polished in a predetermined thickness (e.g., 100 μm), and the lower electrode 114 is then formed on the polished backside surface of the substrate 101 as illustrated in FIG. 14. In this example, the lower electrode 114 is made of a multilayer film of AuGe/Ni/Au.

Process 15: The ohmic conductivity of the upper electrode 113 and the lower electrode 114 is obtained by annealing. As a result, the mesa is formed as the luminescent part.

Process 16: The luminescent parts are then cut per chip, and then implemented in a ceramic package.

A laser emitting direction is measured for each of the luminescent parts in the thus formed surface-emitting laser array 100 when output power is 0.3 mW. The results of the measurements indicate that each of the luminescent parts emits laser light approximately orthogonal to a reference plane of the package.

Figure 20:
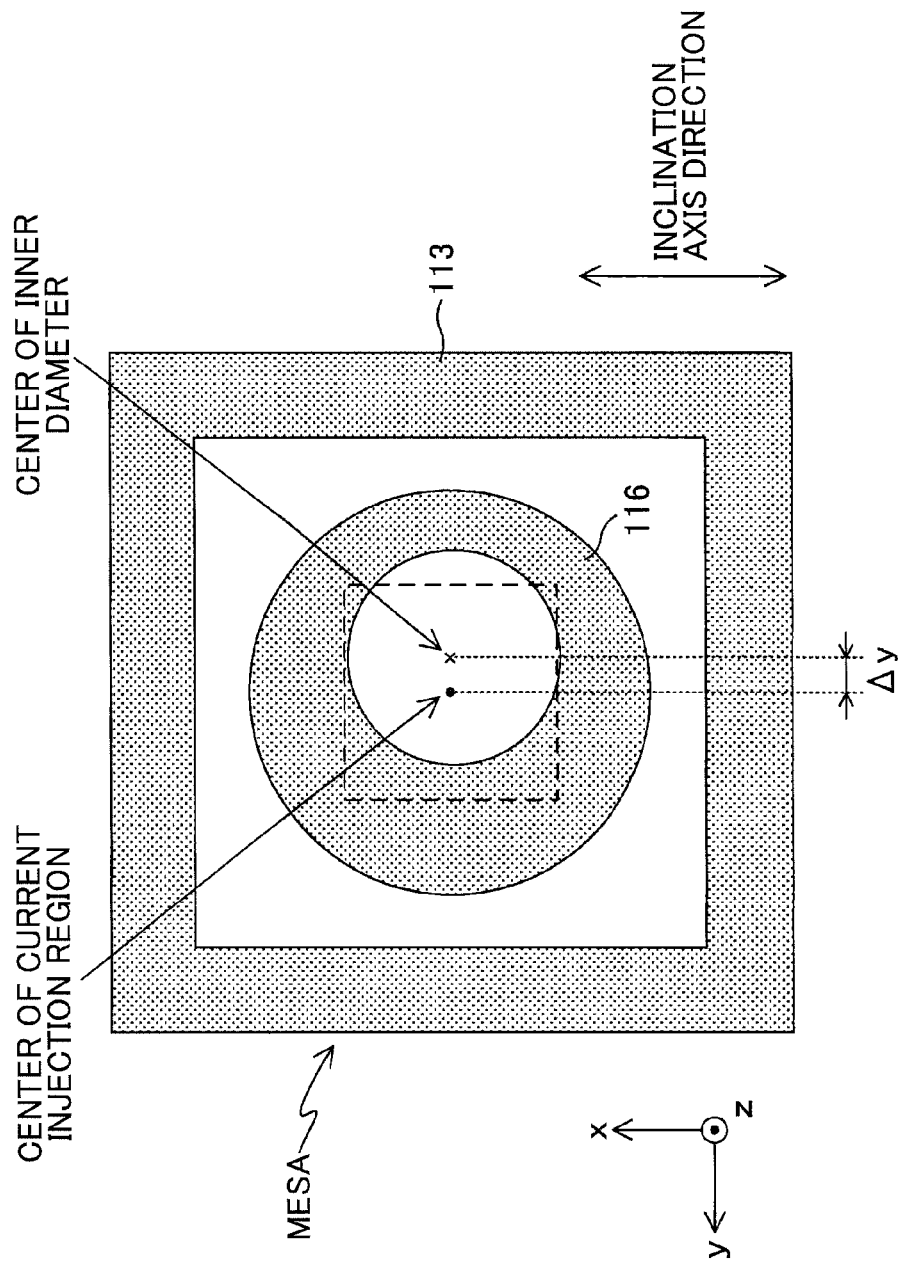
FIG. 20 is a diagram illustrating a comparative example.

FIG. 20 illustrates a comparative example having a layer structure similar to that of the surface-emitting laser array 100. As illustrated in FIG. 20, in the comparative example of the surface-emitting laser array (hereinafter referred to as a "surface-emitting laser array A"), a center of an inner diameter of the dielectric film 116 is shifted by Δy (i.e., Δy=−0.2 μm) from a center of the emission region toward −y direction. A laser emitting direction is measured for each of the luminescent parts in the comparative example of the surface-emitting laser array A when output power is 0.3 mW. The results of the measurements indicate that each of the luminescent parts emitting laser light within a plane orthogonal to the inclined axis of the substrate exhibits inclination in a direction opposite to an inclined direction of the substrate 101 relative to a direction orthogonal to a reference plane of the package. Note that in the surface-emitting laser array A in which a center of an inner diameter of the dielectric film 116 is shifted Δy=0 μm from a center of the emission region, each of the luminescent parts also exhibits laser emitting inclination in a direction opposite to an inclined direction of the substrate 101 relative to a direction orthogonal to a reference plane of the package within a plane orthogonal to the inclined axis of the substrate.

As described above, the surface-emitting laser array 100 according to the embodiment includes the substrate 101, the buffer layer 102, the lower semiconductor DBR 103, the resonator structure, the upper semiconductor DBR 107, the upper electrode 113, the lower electrode 114, the wiring member 115 and the dielectric film 116.

The substrate 101 is the inclined substrate having an x-axis direction as the inclined axis direction. Further, the dimension in the y-axis direction of the current passing region 108b is approximately 5.4 μm. The center of the inner diameter of the dielectric film 116 in viewing from the z-axis direction is shifted by 0.2 μm from the center of the emission region toward +y direction.

In this case, the surface-emitting laser array 100 may be capable of suppressing oscillation of a high-order transverse mode and capable of emitting laser light approximately orthogonal to the reference plane.

Further, in the optical scanner device 2010 according to the embodiment, each of the light sources has the above surface-emitting laser array 100. Accordingly, optical scanning of each of the photoreceptor drums may be carried out with high accuracy.

Further, the color printer 2000 according to the embodiment includes the above optical scanner device 2010. As a result, a high quality image may be formed.

In the surface-emitting laser array 100, the luminescent parts are arranged at equal intervals d2 in a condition where all the luminescent parts are orthogonally projected in a virtual line extended in the sub-scanning direction. Hence, the surface-emitting laser array 100 may have a configuration similar to a case where the luminescent parts are arranged at equal intervals on the photoreceptor drum in the sub-scanning direction by adjusting illuminating timing.

If, for example, the aforementioned intervals d2 is 2.65 μm and magnification of the optical system in the optical scanner device 2010 is two-fold power (2×), the optical scanner device 2010 may be capable of writing an image with high-density resolution of 4800 dpi (dot/inch). Further, if the number of the luminescent parts is increased, if the luminescent parts are arranged in an array configuration where the interval d2 is reduced by narrowing a pitch d1 (see FIG. 7) in the sub-scanning direction, or if the magnification of the optical system is reduced, the optical scanner device 2010 may be capable of writing an image with even higher density resolution, thereby printing the image with high quality. Note that the writing (scanning) intervals in the main-scanning direction may be easily controlled by adjusting illuminating timing of the luminescent parts.

In this case, the color printer 2000 may print the image without lowering printing speeds despite the fact that the writing dot density is increased. Further, the color printer 2000 may print the image with higher printing speeds when the writing dot density is constant.

Moreover, the life-span of the color printer 2000 is increased by efficient use of the surface-emitting laser array 100, which may enable the writing unit or the light source unit to be recycled.

Figure 21:
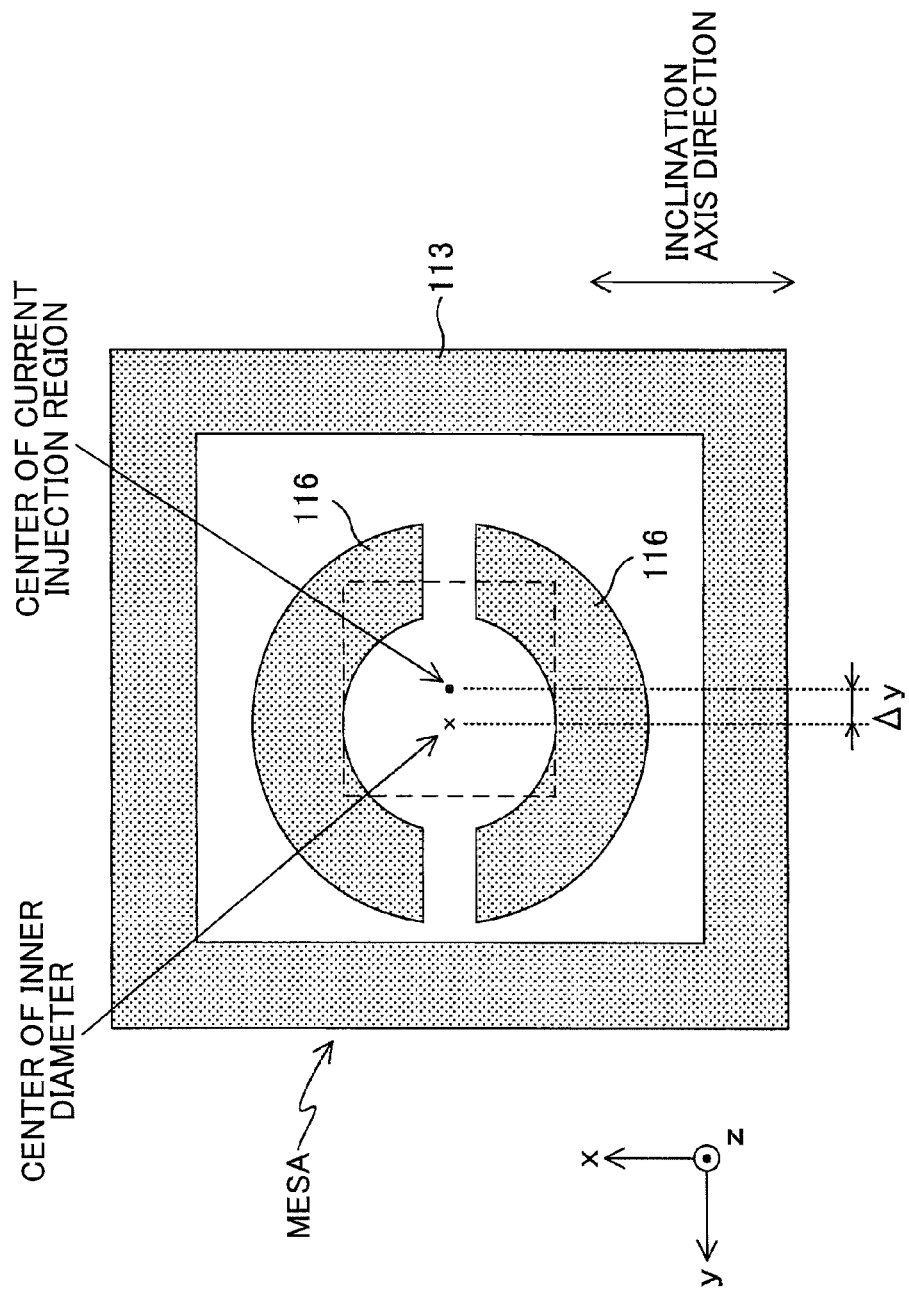
FIG. 21 is a diagram illustrating a modified example of a dielectric film.

Note that in the above embodiment, as illustrated as an example in FIG. 21, the dielectric film 116 may have a ring shape from which two opposing ends in the y-axis direction are removed. In this case, a laser emitting direction is measured for each of the luminescent parts in the thus formed surface-emitting laser array 100 formed in a condition where $\Delta y=0.2$ μm when output power is 0.3 mW. The results of the measurements indicate that each of the luminescent parts emits laser light approximately orthogonal to a reference plane of the package.

Figure 22:
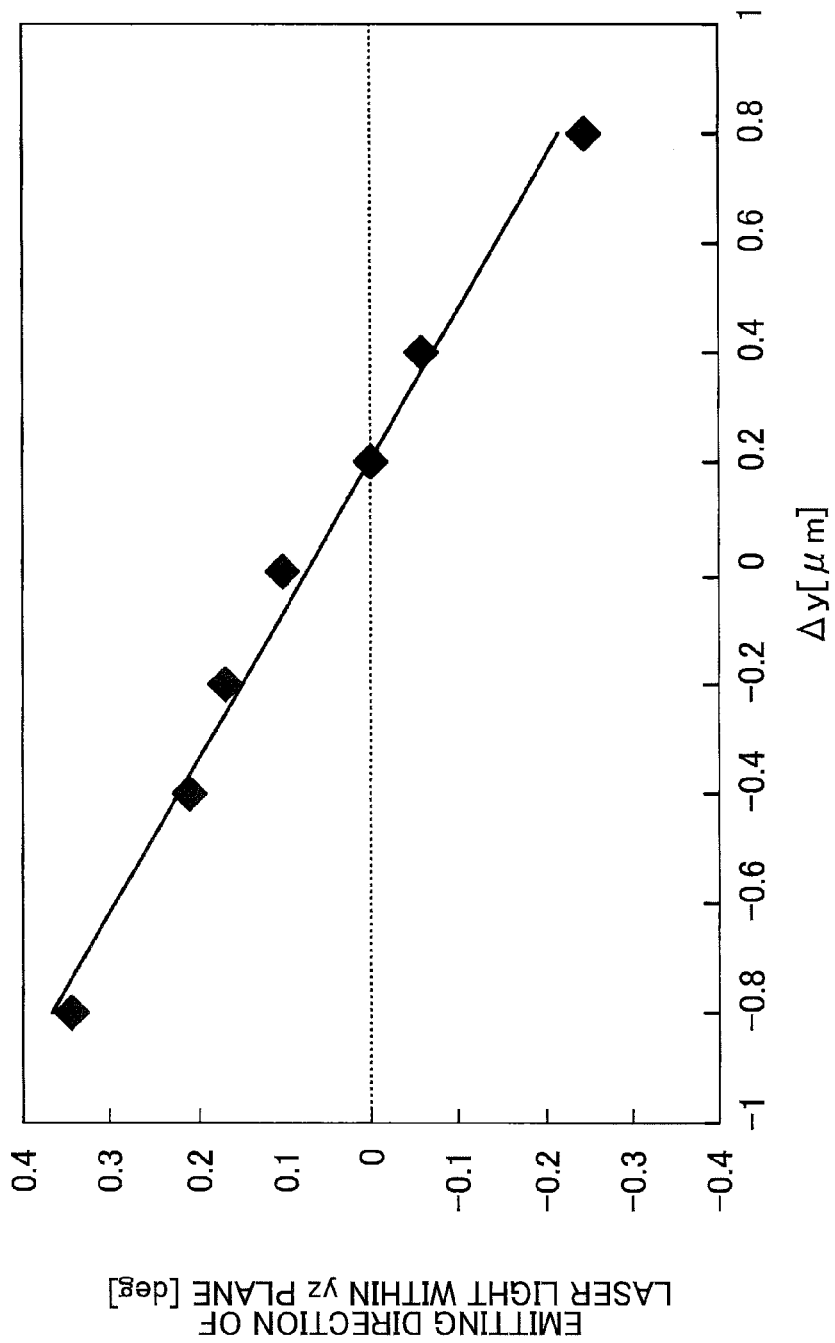
FIG. 22 is a diagram illustrating a relationship between a Δy in the modified example of the dielectric film and an emitting direction.

FIG. 22 illustrates a relationship (measured results) between a value of $\lambda y$ and a laser emitting direction at output power of 0.3 mW in the approximately square surface-emitting laser array that includes the current passing region 108b having a length of approximately 5.4 μm on a side.

As illustrated in FIG. 22, when the value of $\lambda y$ is in a range of 0.2 to 0.4 μm, laser light is emitted in a direction closer to a direction orthogonal to the reference plane compared to a case where the value being $\Delta y=0$ in the related art.

In viewing from the direction orthogonal to the emission region, as illustrated as an example in FIG. 18, an overlapped part of the dielectric film 116 and the current passing region 108b is present on a first side (i.e., −y side) and a second side (i.e., +y side) of an axis direction (i.e., y-axis direction in this example) orthogonal to the inclined axis of the inclined substrate with respect to a center of the current passing region 108b, and an area of the overlapped part on one side differs from an area of the overlapped part on the other side. Note that in the related art example, an area of the overlapped part of the dielectric film and the current passing region on one side is equal to an area of the overlapped part on the other side in the axis direction orthogonal to the inclined axis of the substrate.

Specifically, a direction from the center of the current passing region toward the aforementioned axis direction matches the inclined direction (see FIG. 9A, −y direction in this case). The area of the overlapped part on one side is greater than in the area of the overlapped part on the other side. The radiant intensity distribution is widened in the overlapped part of the dielectric film and the current passing region. Hence, strength of the entire radiant distribution is attracted in the inclined direction so as to change the entire radiant distribution. As a result, even if the inclined substrate is used, the emitting direction may be directed at a direction orthogonal to the reference plane.

In a case where the overlapped part of the dielectric film and the current passing region is increased on the inclined direction side, luminous efficiency of the laser light is not lowered as expected and is the same as that obtained in the surface-emitting laser array formed in a condition where $\Delta y=0$ μm.

Figure 23:
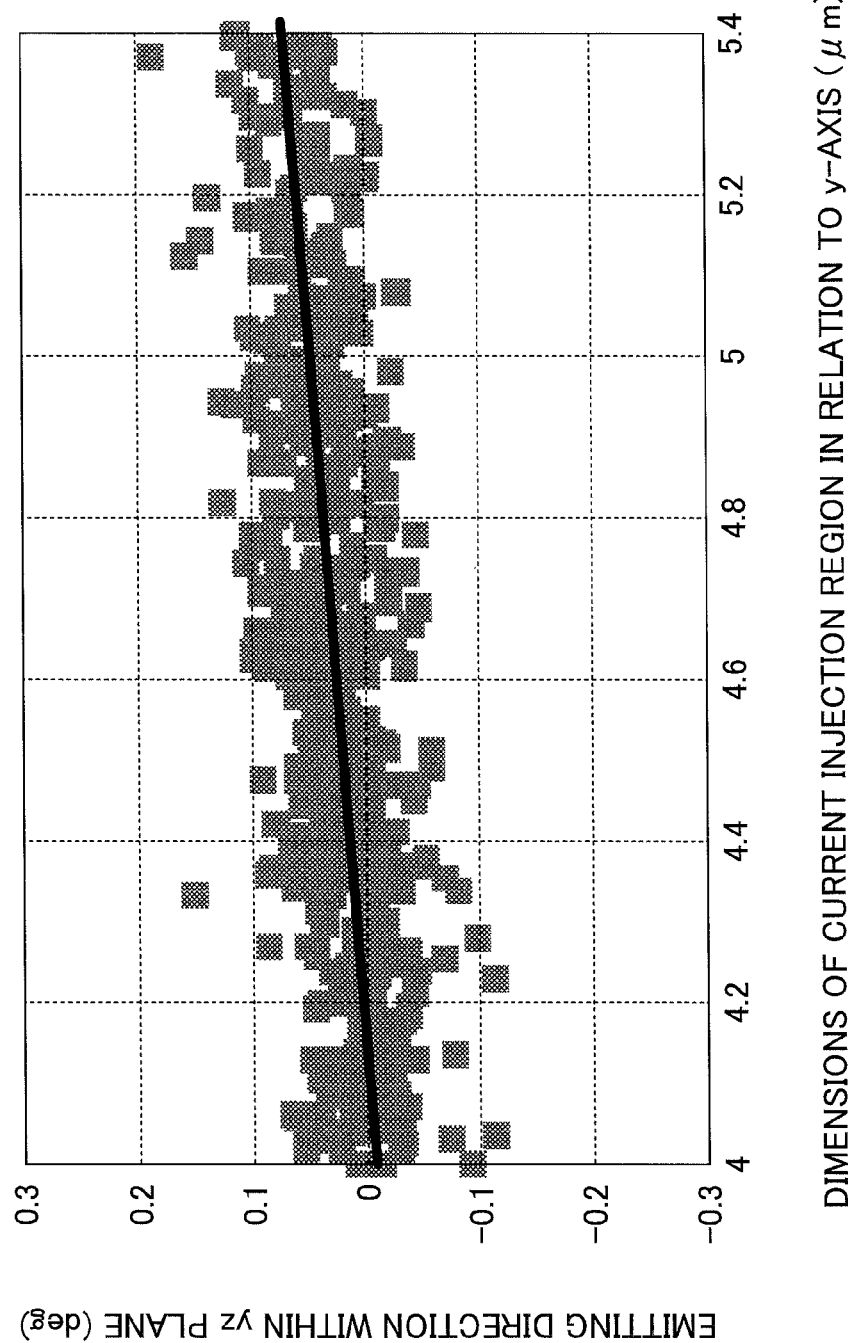
FIG. 23 is a diagram illustrating a relationship between a dimension of a current passing region in a y-axis direction and an emitting direction within a yz plane when a center of an inner diameter of the dielectric film matches a center of the emission region.
Figure 24:
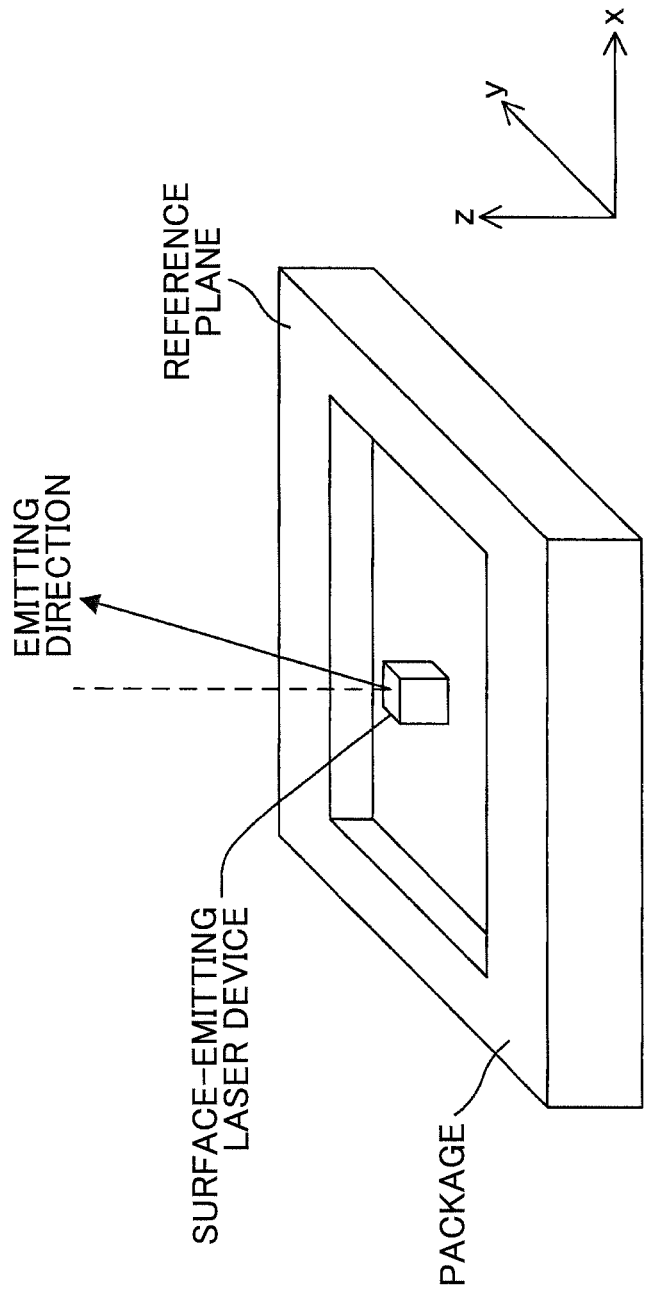
FIG. 24 is a diagram illustrating an emitting direction of laser light emitted from the surface-emitting laser device.
Figure 25A:
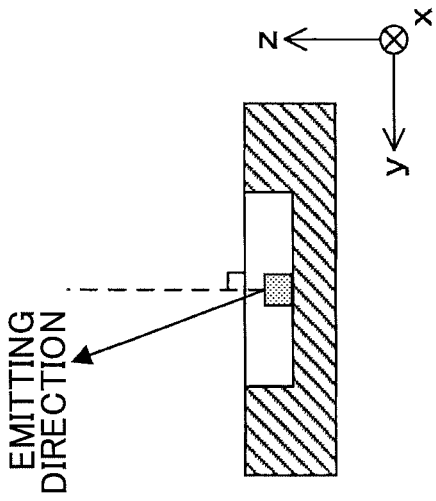
FIGS. 25A and 25B are diagrams each illustrating an emitting direction of laser light emitted from the surface-emitting laser device.
Figure 25B:
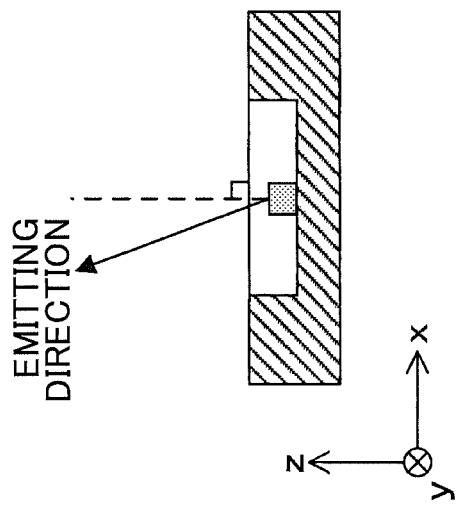
Figure 26A:
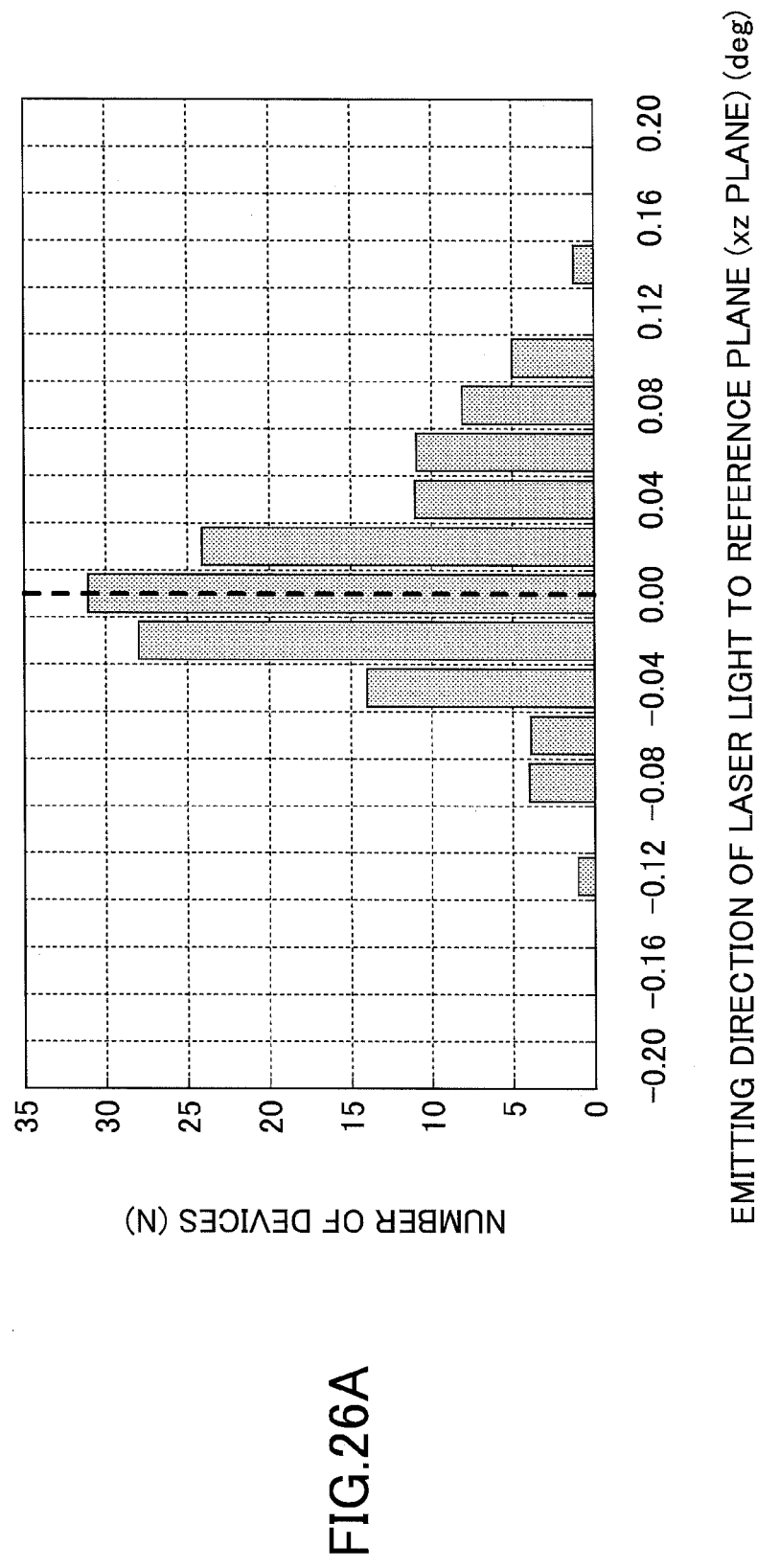
FIGS. 26A and 26B are diagrams each illustrating the frequency of emitting directions of laser light emitted from the surface-emitting laser device.
Figure 26B:
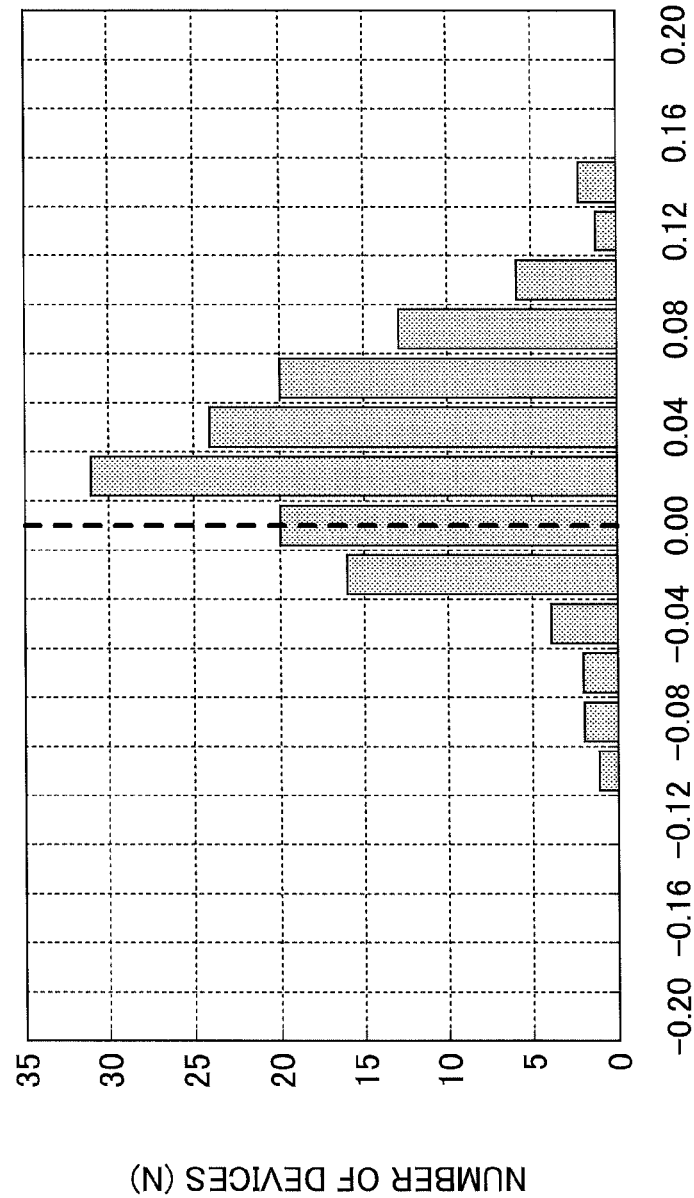

FIG. 23 is a diagram illustrating a relationship between a dimension in the y-axis direction of the current passing region and an emitting direction within the yz plane when a center of an inner diameter of the dielectric film matches a center of the emission region in view of the z-axis direction. As illustrated in FIG. 23, there is a correlation between the dimension in the y-axis direction of the current passing region and the emitting direction. The emitting direction is increased as the dimension in the y-axis direction of the current passing direction increases.

Hence, in viewing from a direction orthogonal to the emission region, a center of a region enclosed by the dielectric film is shifted from the center of the emission region in a direction orthogonal to the inclined axis of the inclined substrate based on a size of the current passing region, which may suppress the oscillation of the high-order transverse mode and may cause the surface-emitting laser array to emit laser light in a direction approximately orthogonal to the reference plane.

Further, in the above embodiment, an outer shape of the cross sectional surface of the mesa is approximately square; however, the outer shape of the cross sectional surface of the mesa may not be limited to the square shape. For example, the outer shape of the cross sectional surface of the mesa may be any of circular, elliptical, and rectangular shapes.

In the above embodiment, the normal line direction of the main surface of the substrate 101 is inclined toward the crystal orientation [1 1 1] A direction relative to the crystal orientation [1 0 0] direction; however, the inclination of the normal line direction of the main surface of the substrate 101 may not be limited to the above described inclination. That is, the substrate 101 may be inclined such that the normal direction of the main surface of the substrate 101 is inclined toward one direction of the crystal orientation [1 1 1]A relative to one direction of the crystal orientation [1 0 0].

Further, in the above embodiment, each of the light sources includes the surface-emitting laser array 100. However, the light source configuration may not be limited to the above-described configuration. For example, each of the light sources may be fabricated in a manner similar to the fabrication of the surface-emitting laser array 100 and the luminescent part may include one surface-emitting laser device.

In the above embodiment, the oscillation wavelength of each of the luminescent parts is 780 nm band; however, the oscillation wavelength of the luminescent part may not be limited to 780 nm band. The oscillation wavelength of the luminescent part may be changed based on characteristics of the photoreceptor drums.

Further, the surface-emitting laser array 100 may be used for apparatuses or devices other than the image forming apparatus in the above embodiment. In such cases, the oscillation wavelength may be 650 nm band, 850 nm band, 980 nm band, 1.3 μm band, or 1.5 μm band based on application purposes.

Further, in the above embodiment, the color printer is used as an example of the image forming apparatus; however, the image forming apparatus may not be limited to the color printer.

In addition, the aforementioned image forming apparatus is configured to transfer a toner image to a recording sheet. However, the aforementioned image forming apparatus may not be limited to such an image forming apparatus. For example, the image forming apparatus may be configured to directly emit laser light toward a color-developing medium (e.g., paper).

Further, the aforementioned image forming apparatus may be configured to utilize a silver-salt film as an image carrying member. In this case, a latent image is formed on the silver-salt film by an optical scanning, and the latent image is visualized by a process similar to a developing process of an ordinary silver halide photography process. Subsequently, the visualized image is transferred onto photographic printing paper by a printing process similar to that carried out in the ordinary silver halide photography process. Such an image forming apparatus may be implemented as an optical plate-making apparatus or an optical plotting apparatus that plots CT scanned images.

The surface-emitting laser device according to the aforementioned embodiment may be capable of suppressing oscillation of the high-order transverse mode and capable of emitting laser light approximately orthogonal to the reference plane.

Further, the optical scanning device according to the aforementioned embodiment may be capable of carrying out optical scanning of a surface subject to scanning with high accuracy.

Moreover, the image forming apparatus according to the aforementioned embodiment may be capable of forming high quality images.

All examples and relationshipal language recited herein are intended for pedagogical purposes to aid the reader in understanding the principles of the invention and the concepts contributed by the inventor to furthering the art, and are to be construed as being without limitation to such specifically recited examples and relationships, nor does the organization of such examples in the specification relate to a showing of the superiority or inferiority of the invention. Although the embodiment of the present invention has been described in detail, it should be understood that various changes, substitutions, and alterations could be made hereto without departing from the spirit and scope of the invention.

This patent application is based on Japanese Priority Patent Application No. 2011-167955 filed on Aug. 1, 2011, and Japanese Priority Patent Application No. 2012-130844 filed on Jun. 8, 2012, the entire contents of which are hereby incorporated herein by reference.

What is claimed is:

1. A surface-emitting laser device comprising:
a lower reflector, a resonator structure having an active layer and an upper reflector layered on an inclined substrate; and
an emission region enclosed by an electrode, the emission region being configured to emit laser light, wherein
the upper reflector includes a confinement structure having a current passing region enclosed by an oxide, the oxide containing at least an oxide generated as a result of partial oxidation of a layer containing aluminum subject to selective oxidation, and
a dielectric film formed within the emission region, the dielectric film at least enclosing a partial region including a center of the emission region, and wherein
in viewing from a direction orthogonal to the emission region, a center of a region enclosed by the dielectric film is located at a position distant from the center of the emission region based on a size of the confinement structure relative to a direction orthogonal to an inclined axis of the inclined substrate.

2. The surface-emitting laser device as claimed in claim 1, wherein
the dielectric film has a ring shape in viewing from the direction orthogonal to the emission region.

3. The surface-emitting laser device as claimed in claim 1, wherein
the dielectric film has a ring shape that is split at least at one place in viewing from the direction orthogonal to the emission region.

4. The surface-emitting laser device as claimed in claim 3, wherein
the dielectric film has the ring shape that is split at two mutually facing places in a direction parallel to the inclined axis of the inclined substrate in viewing from the direction orthogonal to the emission region.

5. The surface-emitting laser element as claimed in claim 1, wherein
an overlapped part of the dielectric film and the current passing region is present on each of a first side and a second side of an axis direction orthogonal to the inclined axis of the inclined substrate relative to a center of the current passing region in viewing from the direction orthogonal to the emission region, and
an area of the overlapped part on the first side differs from an area of the overlapped part on the second side.

6. The surface-emitting laser device as claimed in claim 5, wherein
a direction from the center of the current passing region to the first side in the axis direction corresponds to an inclined direction, and
the area of the overlapped part on the first side is larger than the area of the overlapped part on the second side.

7. The surface-emitting laser device as claimed in claim 1, wherein
an optical thickness of the dielectric film is an odd multiple of an oscillation wavelength/4.

8. The surface-emitting laser device as claimed in claim 1, wherein
the dielectric film is made of any of $SiN_x$, $SiO_x$, $TiO_x$, and SiON.

9. An optical scanner device for optically scanning a scanning surface with emitting light, the optical scanner device comprising:
a light source including the surface-emitting laser device as claimed in claim 1;
a deflector configured to deflect light emitted from the light source; and
a scanning optical system configured to converge the light deflected by the deflector onto the scanning surface.

10. An image forming apparatus comprising:
at least one image carrier; and
the optical scanner device as claimed in claim 9 configured to scan light modulated based on image information relative to the at least one image carrier.

11. The image forming apparatus as claimed in claim 10, wherein
the image information is multicolored image information.

* * * * *

UNITED STATES PATENT AND TRADEMARK OFFICE
CERTIFICATE OF CORRECTION

PATENT NO.        : 8,649,409 B2  
APPLICATION NO.   : 13/562896  
DATED             : February 11, 2014  
INVENTOR(S)       : Sasaki et al.

Page 1 of 1

It is certified that error appears in the above-identified patent and that said Letters Patent is hereby corrected as shown below:

Replace item (30) on the title page of the patent with the following:

-- (30) Aug. 1, 2011   (JP) ..................... 2011-167955  
         June 8, 2012   (JP) ..................... 2012-130844 --.

Signed and Sealed this  
Tenth Day of June, 2014

Michelle K. Lee  
*Deputy Director of the United States Patent and Trademark Office*